United States Patent
Saitoh et al.

(10) Patent No.: US 8,970,535 B2
(45) Date of Patent: Mar. 3, 2015

(54) ELECTRONIC APPARATUS, AND METHOD FOR CONTROLLING ELECTRONIC APPARATUS

(75) Inventors: Kohji Saitoh, Osaka (JP); Akizumi Fujioka, Osaka (JP); Masami Ozaki, Osaka (JP); Toshihiro Yanagi, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 14/009,185

(22) PCT Filed: Apr. 3, 2012

(86) PCT No.: PCT/JP2012/059116
§ 371 (c)(1),
(2), (4) Date: Oct. 1, 2013

(87) PCT Pub. No.: WO2012/137790
PCT Pub. Date: Oct. 11, 2012

(65) Prior Publication Data
US 2014/0191989 A1 Jul. 10, 2014

(30) Foreign Application Priority Data
Apr. 7, 2011 (JP) .................................. 2011-085816

(51) Int. Cl.
*G06F 3/041* (2006.01)
*G09G 3/36* (2006.01)
(Continued)

(52) U.S. Cl.
CPC ............ *G06F 3/0416* (2013.01); *G09G 3/3614* (2013.01); *G09G 3/3648* (2013.01);
(Continued)

(58) Field of Classification Search
USPC ......... 345/173, 174, 104, 3, 33, 44, 180, 181, 345/182, 183, 184; 178/18.01, 18.02, 19; 341/5
See application file for complete search history.

(56) References Cited

U.S. PATENT DOCUMENTS 4,841,290 A    6/1989  Nakano et al.
5,491,706 A *  2/1996  Tagawa et al. ................ 714/812
(Continued)

FOREIGN PATENT DOCUMENTS

EP    1 983 409 A1    10/2008
JP    7-191806 A  *    7/1995    .............. G06F 3/033
(Continued)

OTHER PUBLICATIONS

Official Communication issued in corresponding European Patent Application No. 12767754.0, mailed on Jul. 30, 2014.
Official Communication issued in International Patent Application No. PCT/JP2012/059116, mailed on Jun. 12, 2012.

Primary Examiner — Olga Merkoulova
(74) Attorney, Agent, or Firm — Keating & Bennett, LLP

(57) ABSTRACT

Electronic apparatus (100) includes a display device (1), a detecting device (20) which detects an input, a state change detecting section (31), and a control section. The control section controls the detecting device (20) so that the detecting device (20) carries out the detection more times during a non-scanning period in a case where a state change causing an improvement in detection accuracy is detected and so that the detecting device (20) carries out the detection fewer times during the non-scanning period in a case where the state change causing a deterioration in detection accuracy is detected. With the configuration, it is possible to improve detection accuracy of the detecting device while reducing electric power consumption.

18 Claims, 20 Drawing Sheets

(51) Int. Cl.
*G06F 3/044* (2006.01)
*G06F 1/32* (2006.01)
*H01L 27/32* (2006.01)

(52) U.S. Cl.
CPC .............. *G06F3/0412* (2013.01); *G06F 3/044* (2013.01); *G06F 1/3262* (2013.01); *G09G 3/3677* (2013.01); *G09G 2330/022* (2013.01); *G09G 2370/04* (2013.01); *H01L 27/323* (2013.01); *G09G 3/3688* (2013.01)
USPC ............ 345/173; 345/174; 345/104; 345/3.4; 345/3.2; 178/18.01; 178/18.02

(56) References Cited

U.S. PATENT DOCUMENTS

2002/0180673 A1   12/2002  Tsuda et al.
2010/0156853 A1*   6/2010  Narusawa ..................... 345/183

FOREIGN PATENT DOCUMENTS

| JP | 2000-181624 A | * | 6/2000 | .............. G06F 3/033 |
| JP | 2001-312253 A | | 11/2001 | |
| JP | 2009-294903 A | | 12/2009 | |

* cited by examiner

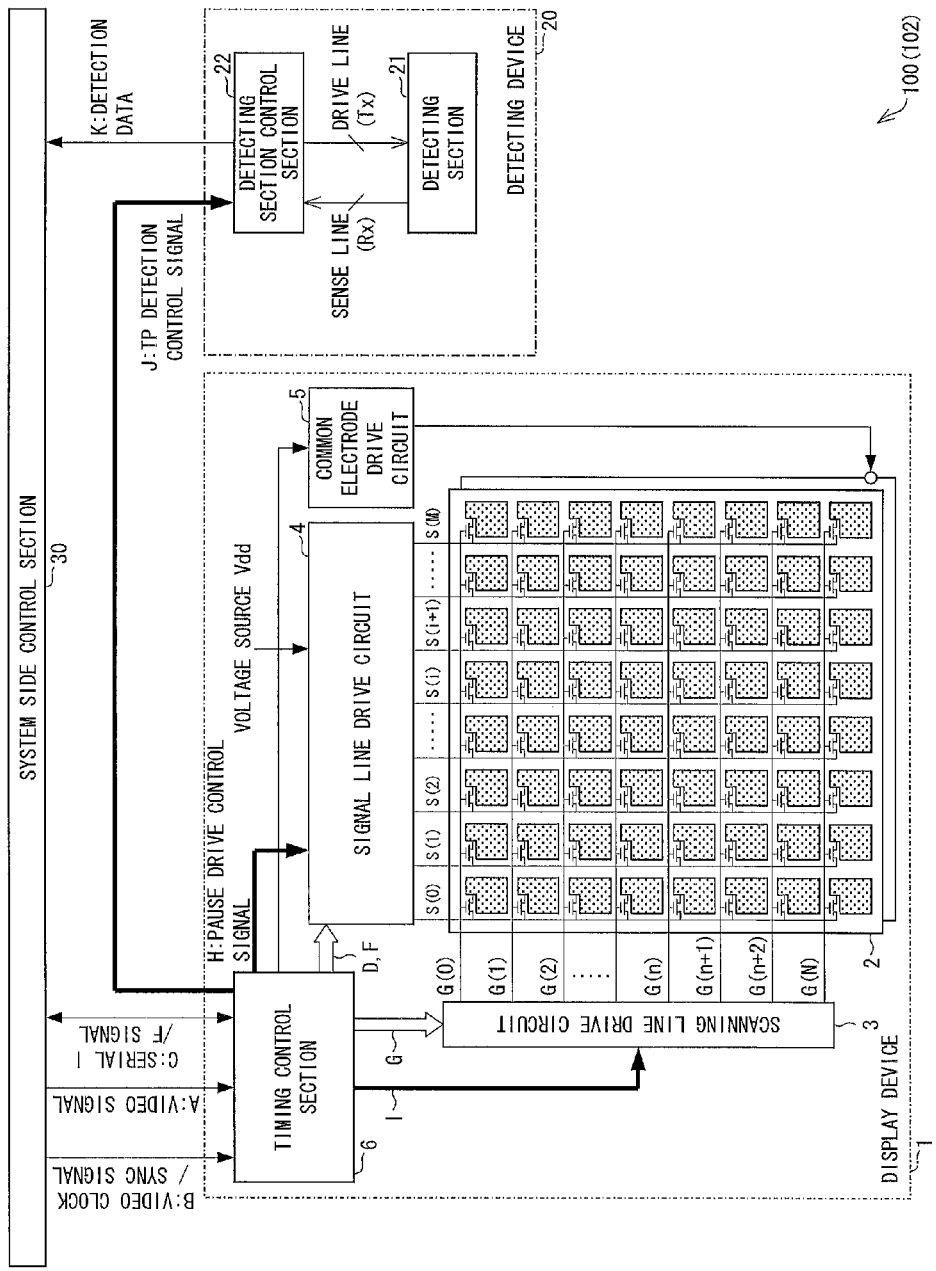
F I G. 1

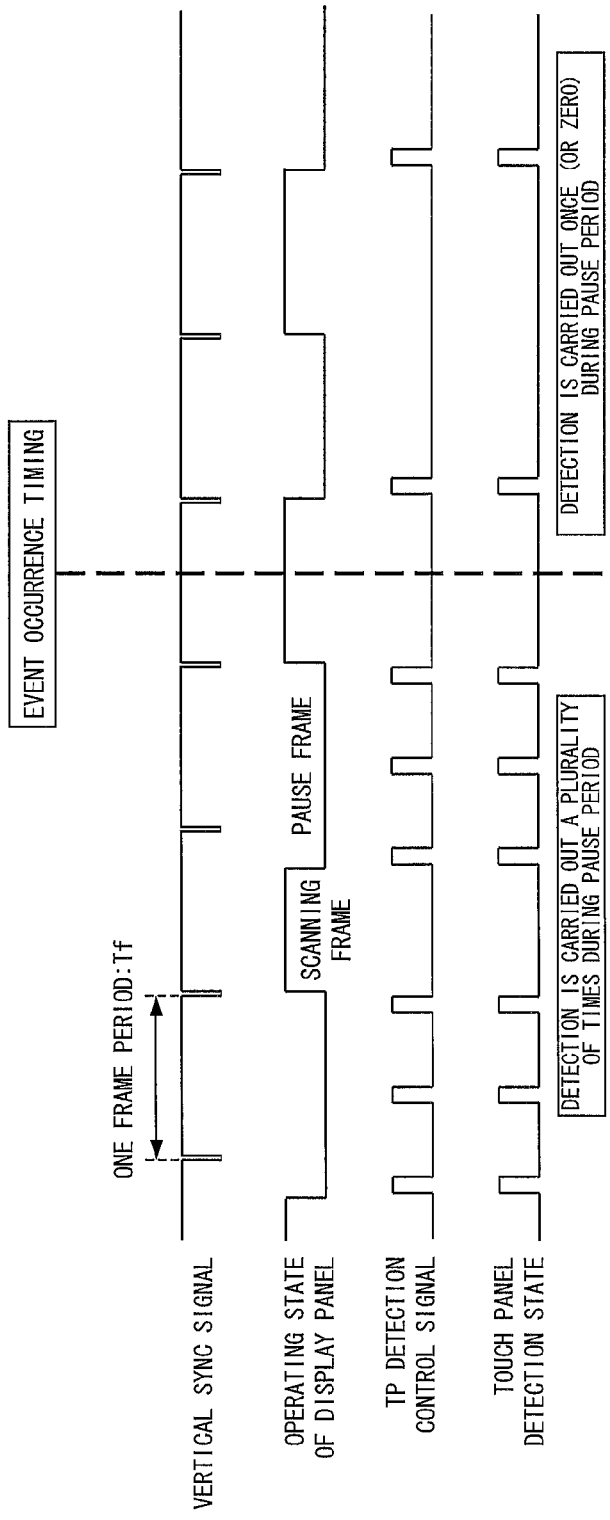

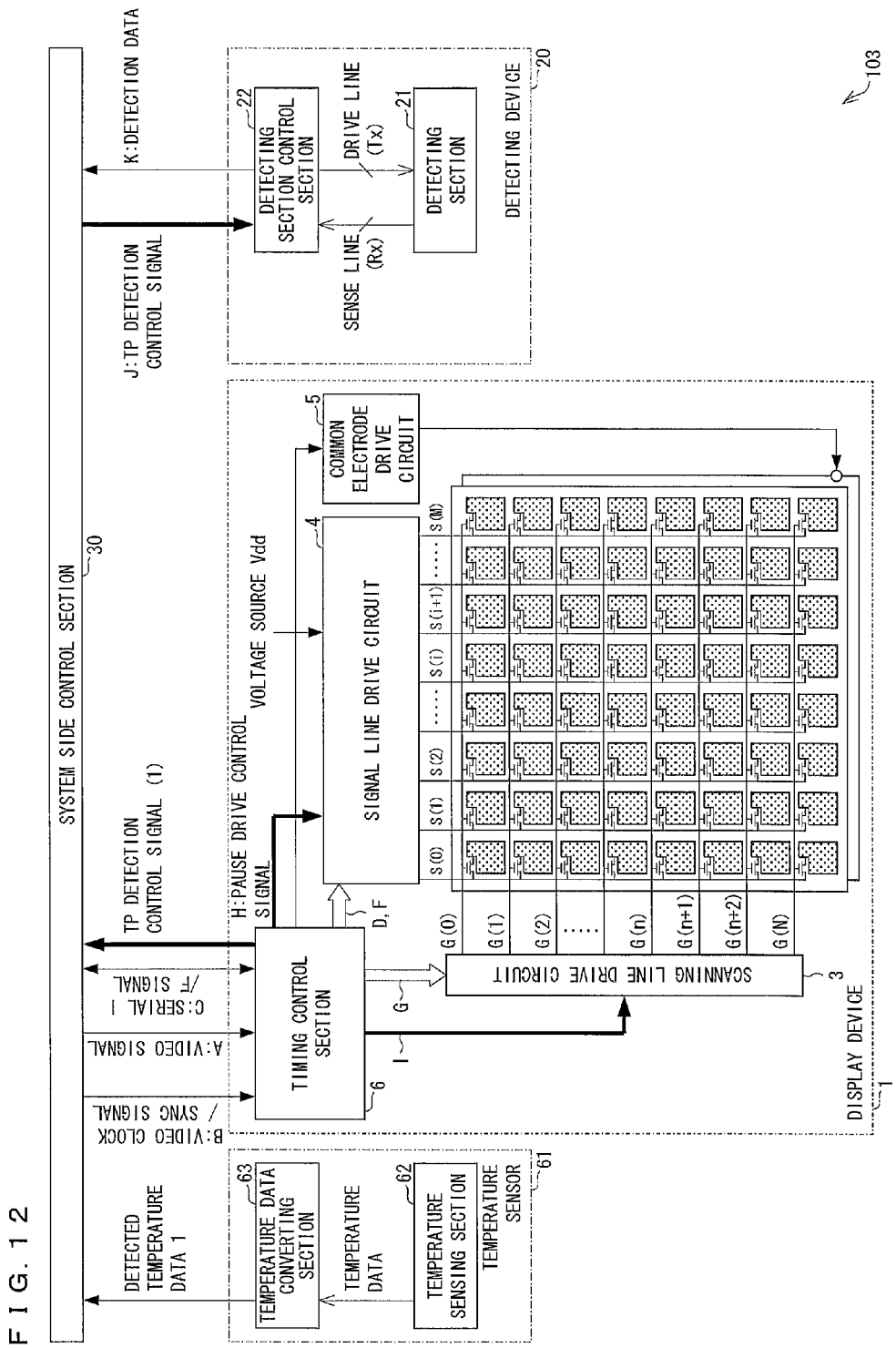
F I G. 1 2

TP DETECTION CONTROL SIGNAL

ELECTRONIC APPARATUS, AND METHOD FOR CONTROLLING ELECTRONIC APPARATUS

TECHNICAL FIELD

The present invention relates to an electronic apparatus including (i) a display device and (ii) a detecting device which detects an input. The present invention also relates to a method for controlling the electronic apparatus.

BACKGROUND ART

In recent years, display devices have been widely used which are thin, lightweight, and low in electric power consumption, and are typified by liquid crystal display devices. Such display devices are particularly provided to, for example, electronic apparatuses such as a mobile phone, a smart phone, and a laptop personal computer. Further, electronic paper, which is a thinner display device, is expected to be rapidly developed and widespread in the future. Under such circumstances, a reduction in electric power consumption in various kinds of display devices is a common object at present.

Patent Literature 1 discloses a method for driving a display device in which method low electric power consumption is realized by providing a pause period (i) which is a non-scanning period longer than a scanning period during which a screen is scanned once and (ii) during which no scanning signal lines are scanned.

Meanwhile, in more cases, the electronic apparatus is provided with a touch panel serving as a detecting device which detects an input operation carried out by a user. In particular, the electronic device which is a tablet information terminal device is more likely to be provided with such a touch panel.

CITATION LIST

Patent Literature 1

Japanese Patent Application Publication, Tokukai, No. 2001-312253 A (Publication Date: Nov. 9, 2001)

SUMMARY OF INVENTION

Technical Problem

In a case where the electronic apparatus is, for example, a tablet information terminal device provided with a touch panel serving as a detecting device, the touch panel is provided near a display device, e.g., on the display device. Such an electronic apparatus suffers the following problem. That is, a noise produced from the display device during the scanning period of the display device reduces S/N of the touch panel, so that detection accuracy deteriorates. This problem is noticeable in a case where the touch panel is a capacitance touch panel.

In view of the circumstances, it is considered to carry out, during the non-scanning period of the display device, detection of an input operation carried out by a user with respect to the touch panel. In this case, it is possible to avoid the problem of the reduction in S/N of the touch panel due to a noise produced from the display device.

However, according to the electronic apparatus, detection accuracy required for the detecting device such as the touch panel is not always constant. The detection accuracy varies depending on types of input operations carried out with respect to the detecting device or types of activated application software. Furthermore, accuracy of the detecting device also varies depending on a change in external environment such as temperature.

Therefore, it is impossible to obtain sufficient detection accuracy of the detecting device by merely detecting the input operation during the non-scanning period of the display device. Further, in order to further improve detection accuracy of the detection device, it is necessary to consider a reduction in electric power consumption of the electronic apparatus.

Therefore, an object of the present invention is to provide (i) an electronic apparatus capable of improving detection accuracy of a detecting device while reducing electric power consumption and (ii) a method for controlling the electronic apparatus.

Solution to Problem

In order to attain the above object, electronic apparatus of the present invention includes: a display device which repeats rewriting of image data while alternately repeating (i) a scanning period during which the image data is supplied to a plurality of pixels and (ii) a non-scanning period during which no image data is supplied to the plurality of pixels, the image data retained by the plurality of pixels; a detecting device which detects an input; a state change detecting section which detects a state change causing a change in detection accuracy which the detecting device is required to have so as to detect the input; and a control section which controls the detecting device, the detecting device detecting the input during the non-scanning period of the display device, and the control section controlling the detecting device so that the detecting device carries out the detection more times during the non-scanning period in a case where the state change detecting section detects the state change causing an improvement in detection accuracy which the detecting device is required to have so as to detect the input and so that the detecting device carries out the detection fewer times during the non-scanning period in a case where the state change detecting section detects the state change causing a deterioration in detection accuracy which the detecting device is required to have so as to detect the input.

According to the above configuration, the state change detecting section detects the state change causing a change in detection accuracy which the detecting device is required to have so as to detect the input. The detecting device detects the input during the non-scanning period of the display device. The control section controls the detecting device so that the detecting device carries out the detection more times during the non-scanning period in a case where the state change detecting section detects the state change causing an improvement in detection accuracy which the detecting device is required to have so as to detect the input and so that the detecting device carries out the detection fewer times during the non-scanning period in a case where the state change detecting section detects the state change causing a deterioration in detection accuracy which the detecting device is required to have so as to detect the input.

Examples of the state change causing an improvement in detection accuracy which the detecting device is required to have so as to detect the input include: a change between (i) an input by use of means with which an input operation is easily detected and (ii) an input by use of means with which an input operation is not easily detected; activation and end of an operational mode (application) in which an input operation is carried out at a high speed; and a change in environment which change influences detection accuracy of the detecting device itself.

According to the electronic apparatus (the method for controlling the electronic apparatus), the detecting device carries out the detection more times during the non-scanning period, in a case where the state change causing an improvement in detection accuracy which the detecting device is required to have so as to detect the input (e.g., the state change which causes the detection accuracy of the detecting device to be relatively deteriorated) is detected. Therefore, even in a case where such a state change occurs in the electronic apparatus, it is possible to detect the input with respect to the detecting device with high accuracy.

Meanwhile, in a case where the state change causing a deterioration in detection accuracy which the detecting device is required to have so as to detect the input (e.g., the state change which causes the detection accuracy of the detecting device to be relatively improved) is detected, the detecting device carries out the detection fewer times during the non-scanning period. With this configuration, it is possible to prevent an increase in electric power consumption due to wasteful detection. Accordingly, it is possible to improve the detection accuracy of the detecting device while reducing electric power consumption.

Advantageous Effects of Invention

As described above, according to the configuration of the present invention, it is possible to detect an input with respect to the detecting device with high accuracy, even in a case where a state change occurs which causes an improvement in detection accuracy which the detecting device is required to have so as to carry out detection, that is, which causes the detection accuracy of the detecting device to be deteriorated. Furthermore, it is possible to prevent an increase in electric power consumption due to wasteful detection. Accordingly, it is possible to improve the detection accuracy of the detecting device while reducing electric power consumption.

BRIEF DESCRIPTION OF DRAWINGS

FIG. 1 is an explanatory diagram illustrating a configuration of electronic apparatus in accordance with an embodiment of the present invention.

Figure 3:
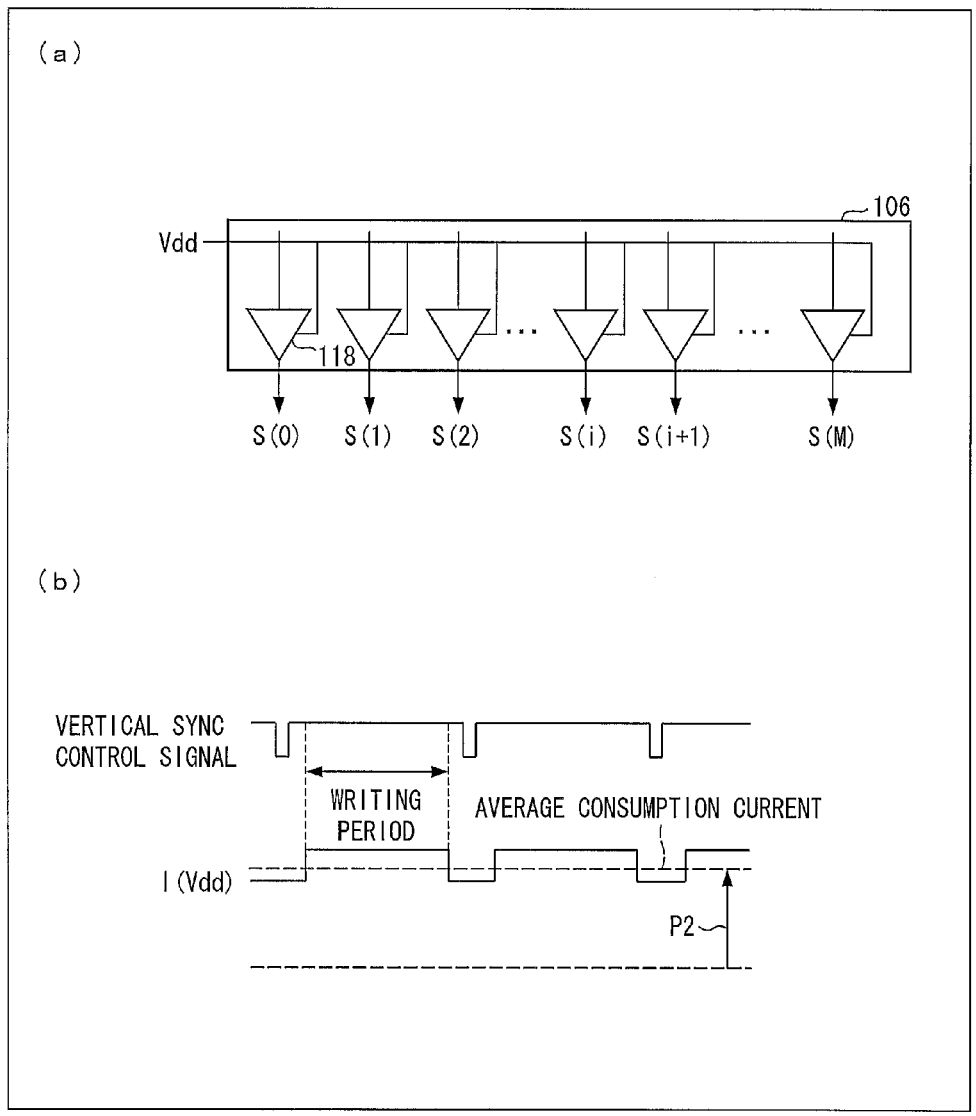

(a) of FIG. 3 is view illustrating an internal configuration of an output part of a signal line drive circuit of a conventional display device. (b) of FIG. 3 is a waveform chart of a consumption electric current of the signal line drive circuit illustrated in (a) of FIG. 3.

Figure 4:
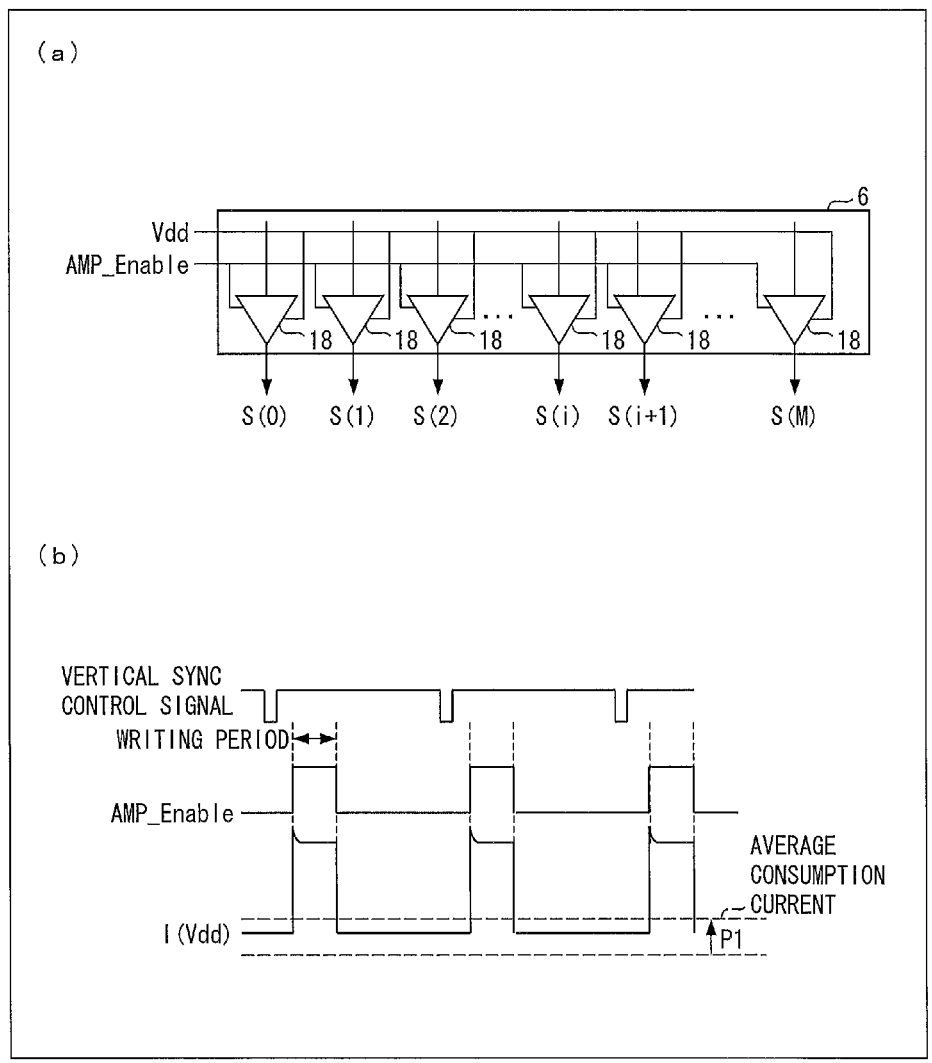

(a) of FIG. 4 is a circuit diagram illustrating a configuration of an output part of a signal line drive section of a display device illustrated in FIG. 1. (b) of FIG. 4 is a waveform chart of an AMP_Enable signal supplied to the signal line drive circuit.

Figure 5:
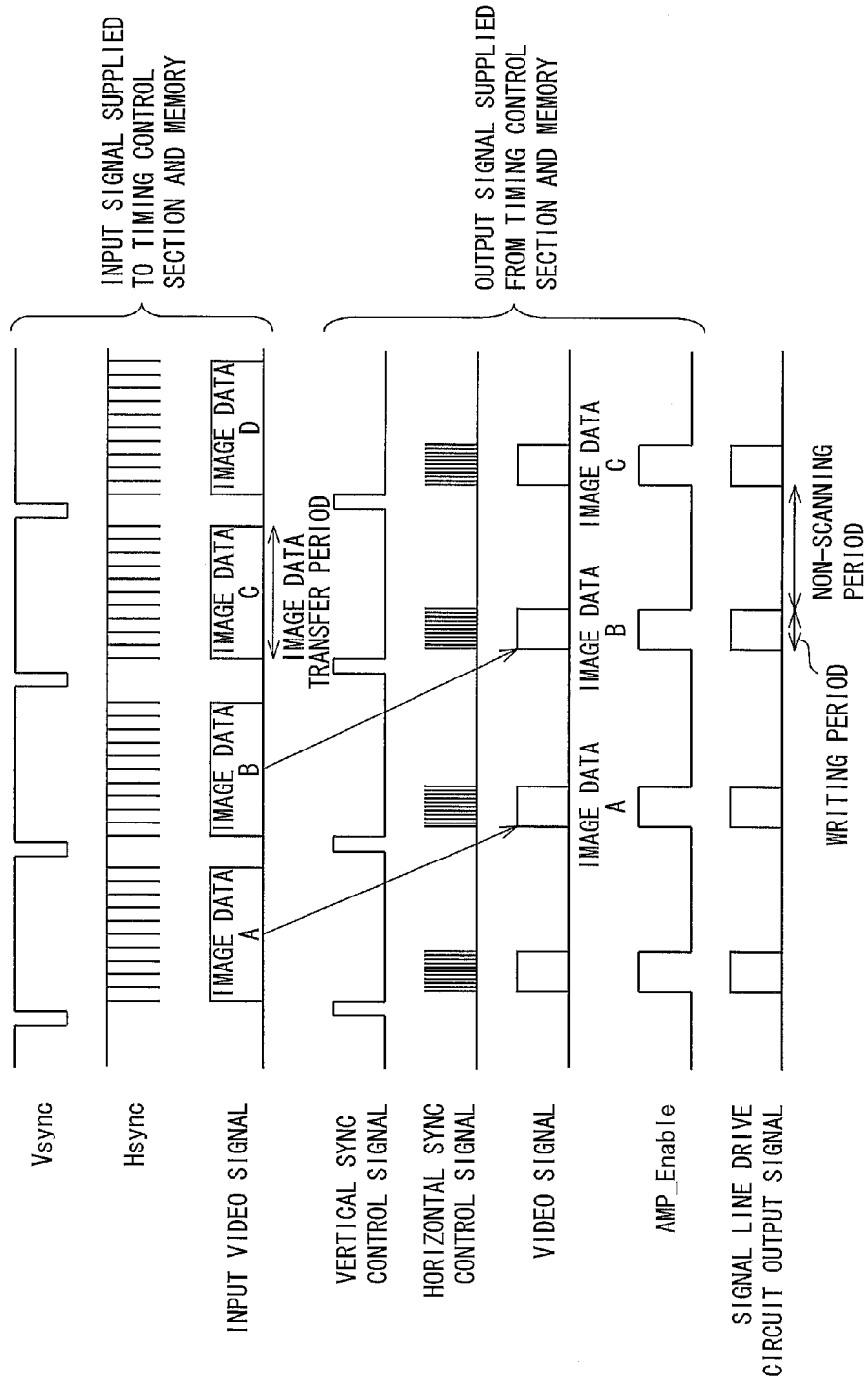

FIG. 5 is a waveform chart of various signals while a display panel of the display device illustrated in FIG. 1 is being driven.

Figure 2:
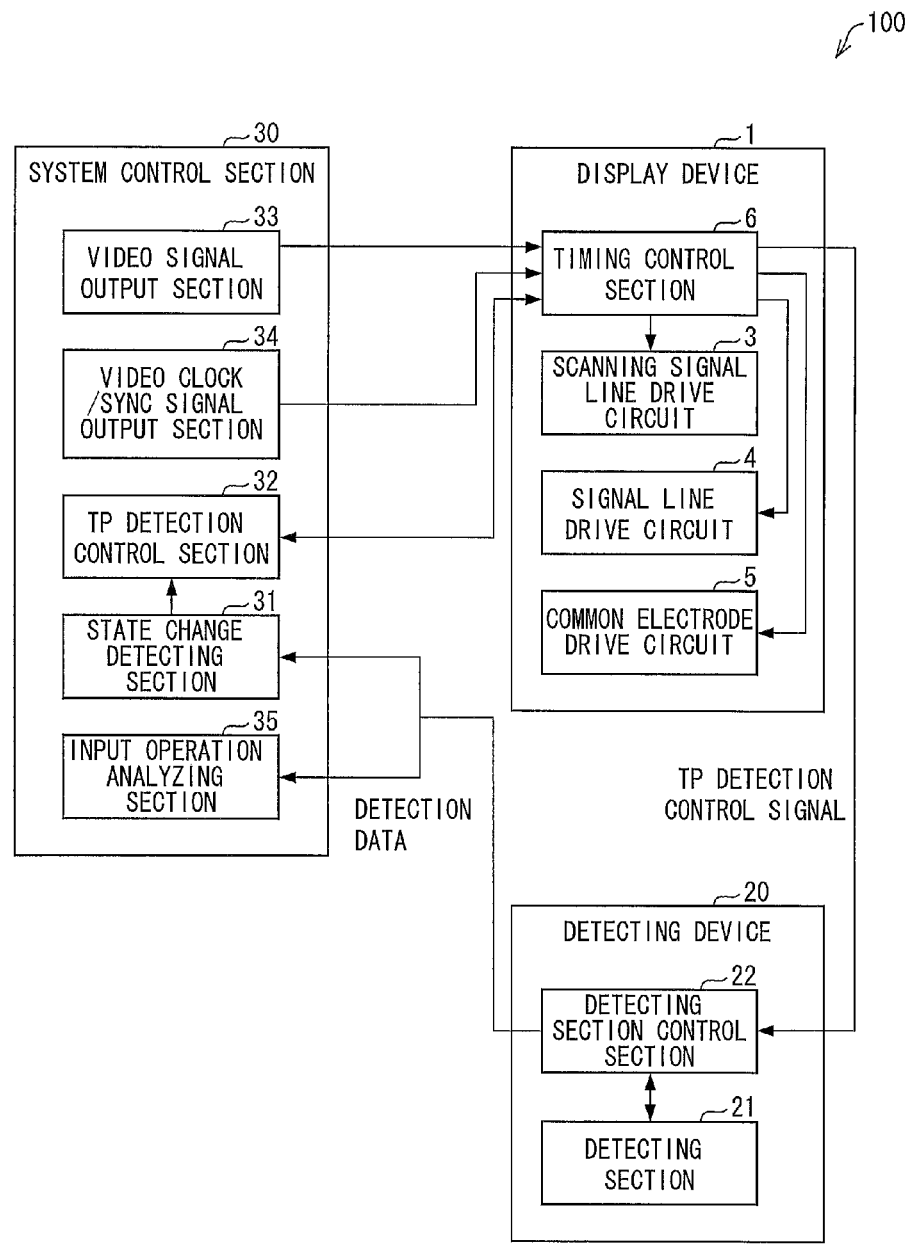
FIG. 2 is a block diagram specifically illustrating a configuration of a system side control section of the electronic apparatus illustrated in FIG. 1.
Figure 6:
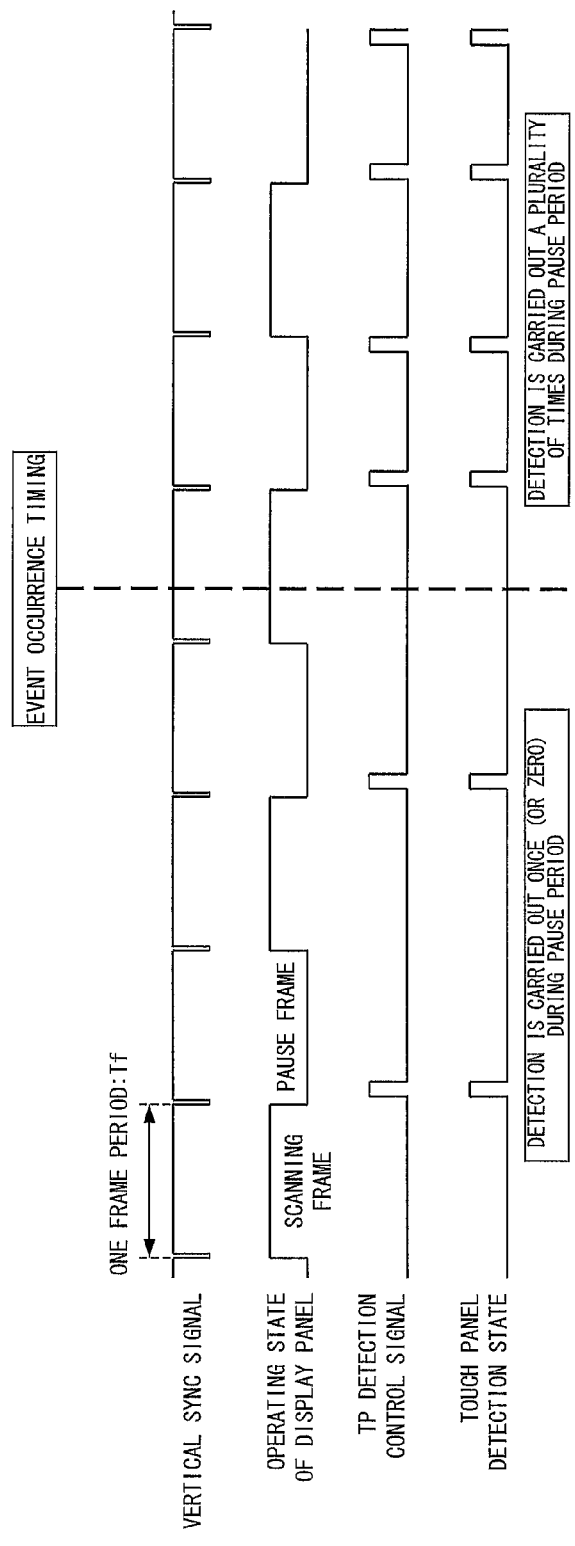

FIG. 6 is a timing diagram which is obtained in a case where the number of times of detection by the detecting section illustrated in FIG. 2 is increased and which illustrates a relationship among a vertical sync signal, an operating state of the display panel, a TP detection control signal, and a detection state of a detecting section.

Figure 7:
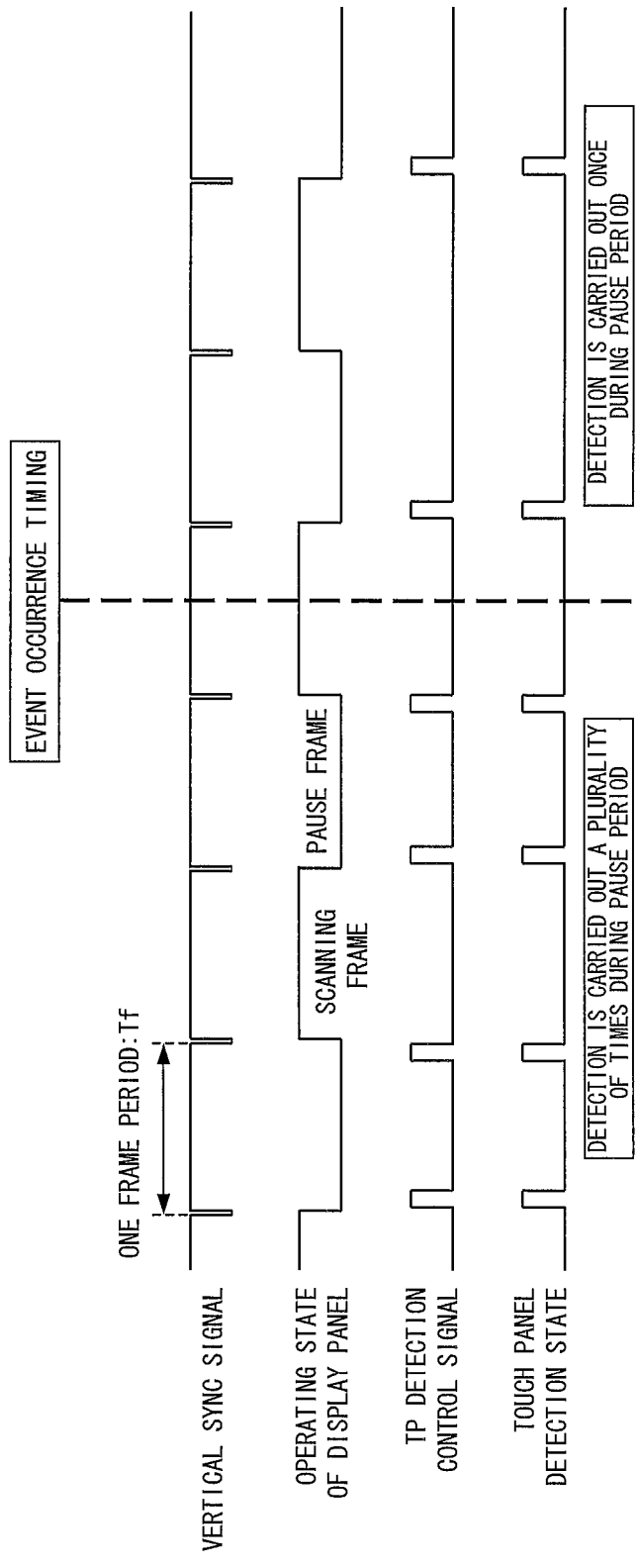

FIG. 7 is a timing diagram which is obtained in a case where the number of times of the detection by the detecting section illustrated in FIG. 2 is decreased and which illustrates a relationship among the vertical sync signal, an operating state of the display panel, the TP detection control signal, and a detection state of the detecting section.

Figure 8:
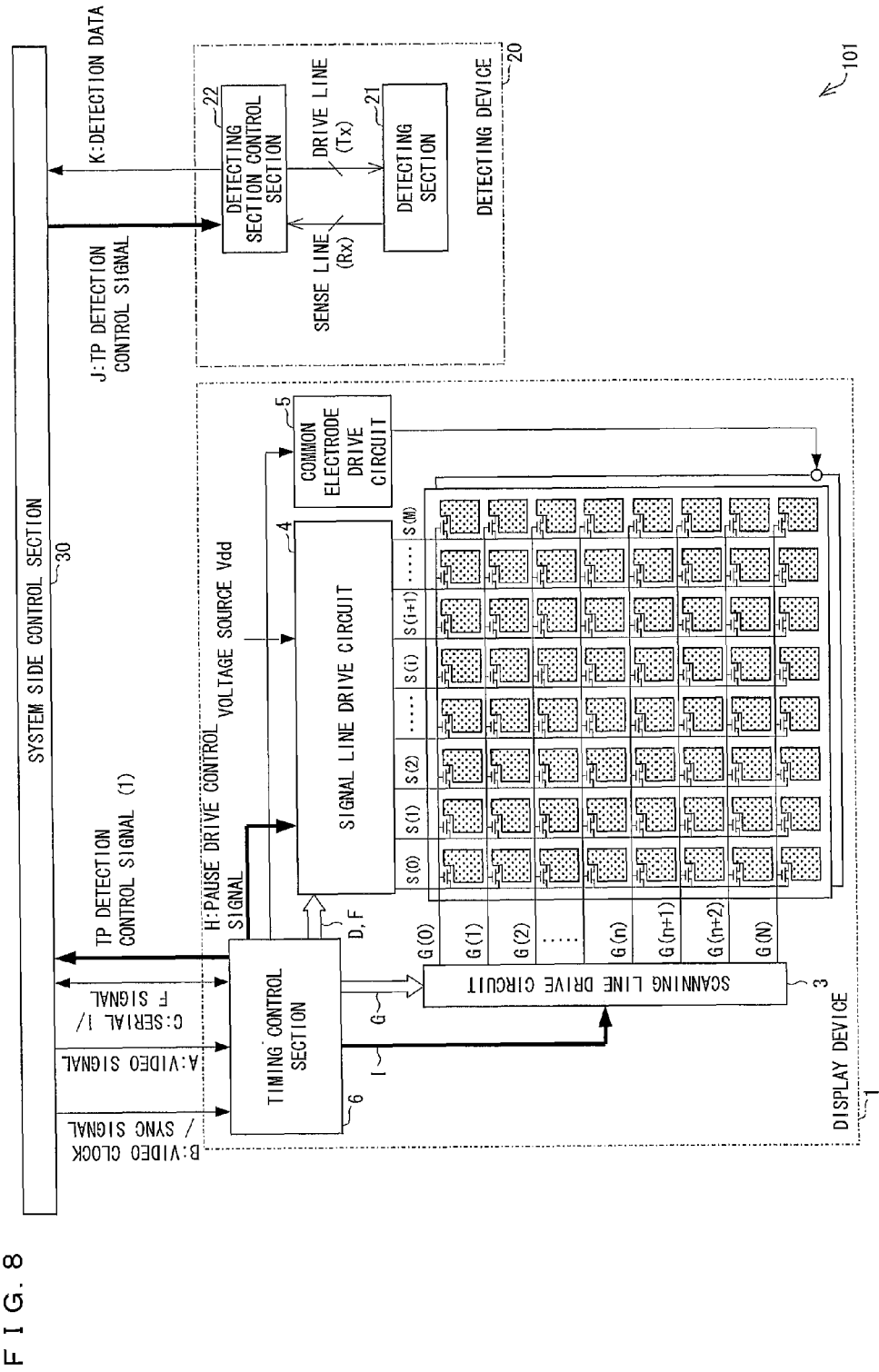

FIG. 8 is an explanatory diagram illustrating a configuration of electronic apparatus which is another example of the electronic apparatus illustrated in FIG. 1.

Figure 9:
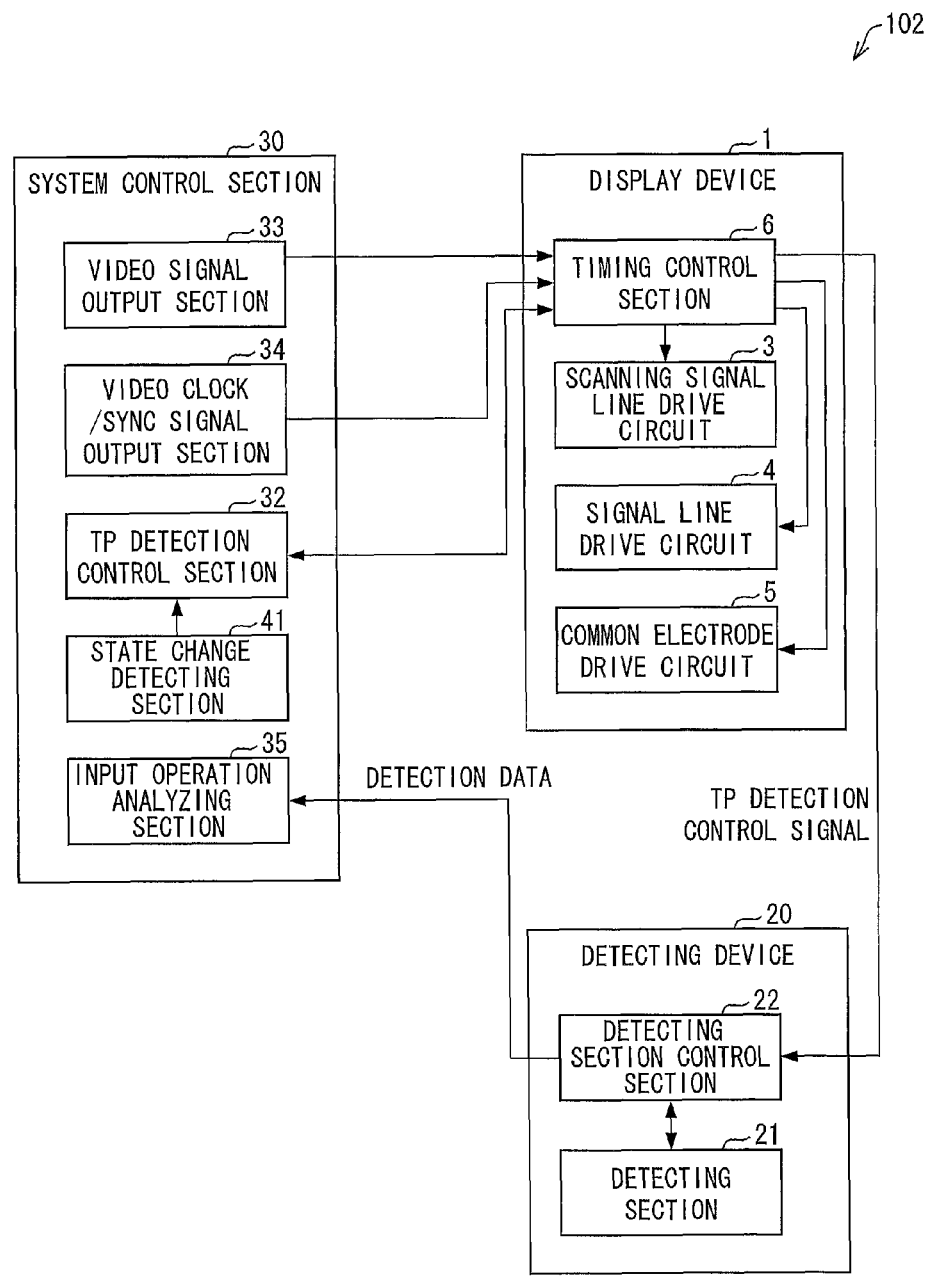

FIG. 9 is a block diagram specifically illustrating a configuration of a system side control section of the electronic apparatus of another embodiment of the present invention.

Figure 10:
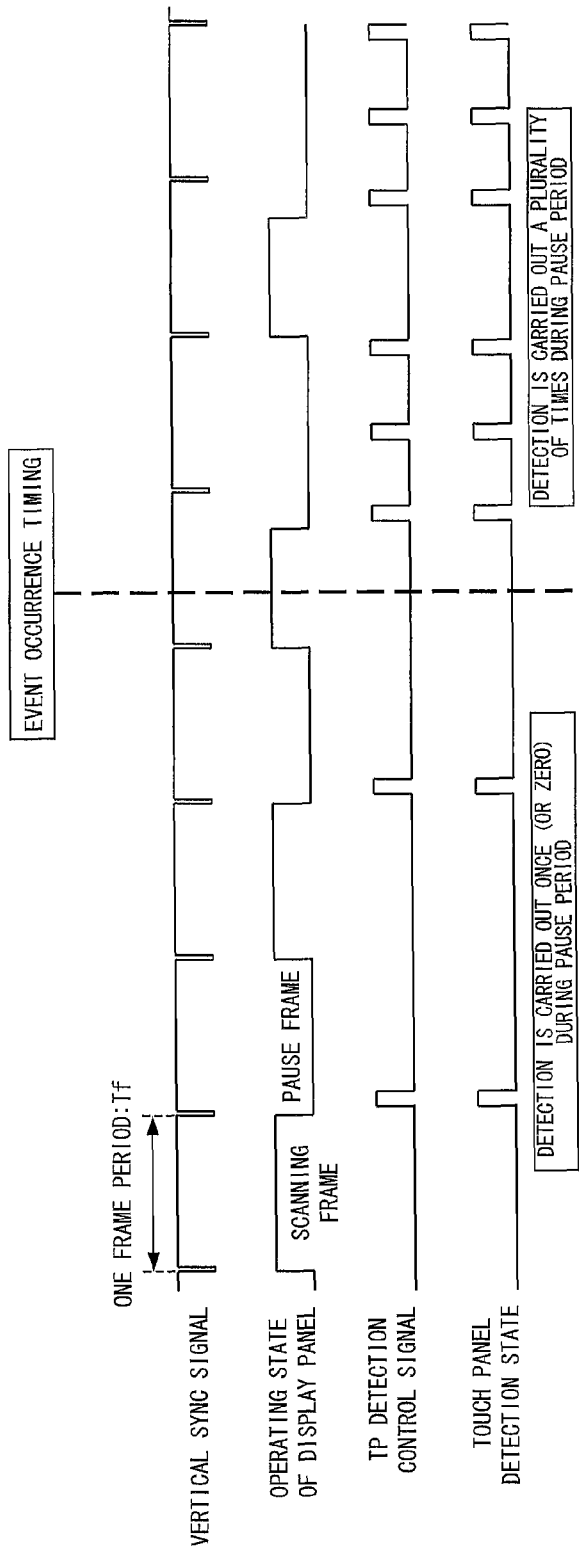

FIG. 10 is a timing diagram which is obtained in a case where the number of times of detection by the detecting section illustrated in FIG. 9 is increased and which illustrates a relationship among a vertical sync signal, an operating state of a display panel, a TP detection control signal, and a detection state of a detecting section.

FIG. 11 is a timing diagram which is obtained in a case where the number of times of the detection by the detecting section illustrated in FIG. 9 is decreased and which illustrates a relationship among the vertical sync signal, an operating state of the display panel, the TP detection control signal, and a detection state of the detecting section.

FIG. 12 is an explanatory diagram illustrating a configuration of electronic apparatus which is further another example of the electronic apparatus of the present invention.

Figure 13:
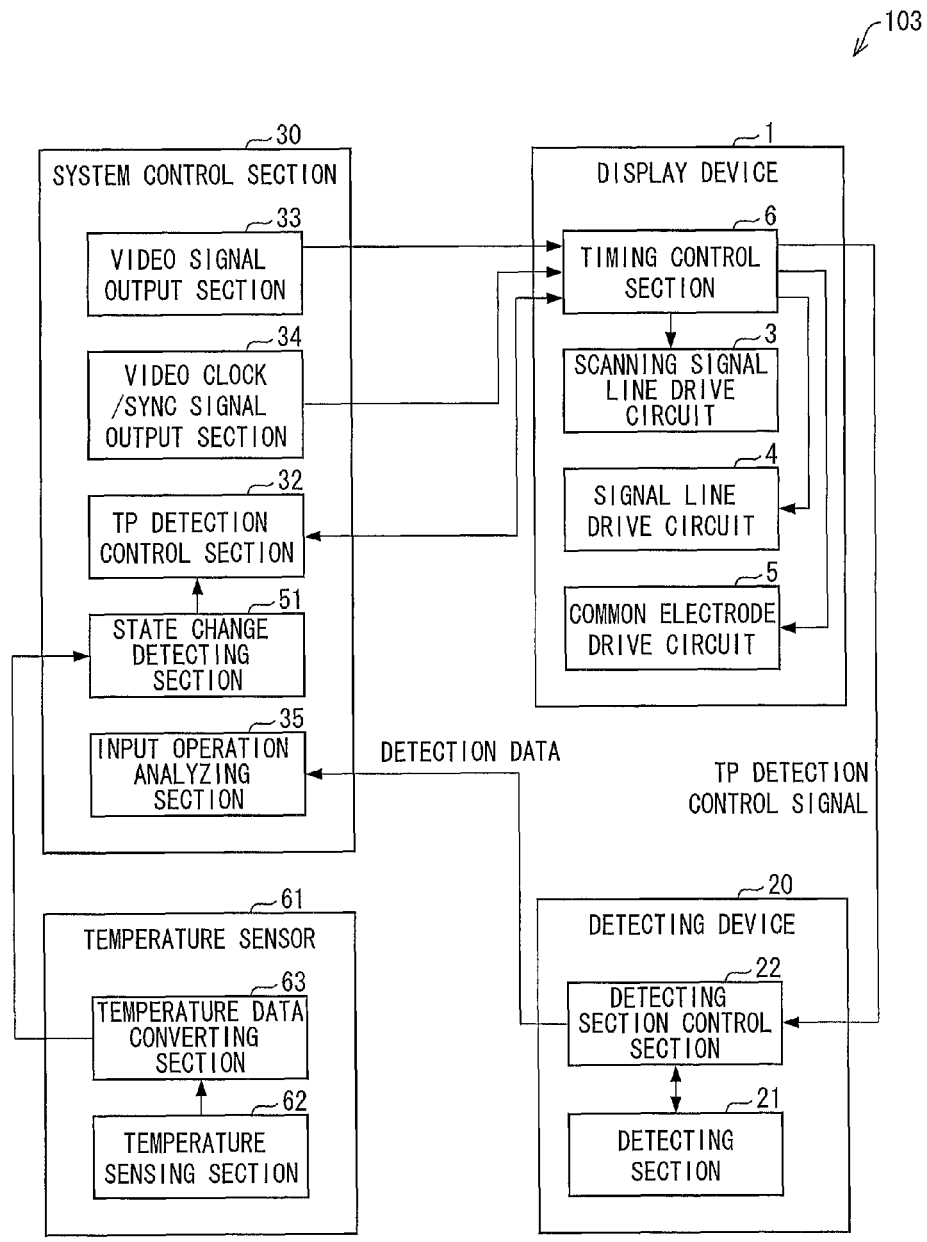

FIG. 13 is a block diagram specifically illustrating a configuration of a system side control section of the electronic apparatus illustrated in FIG. 12.

Figure 14:
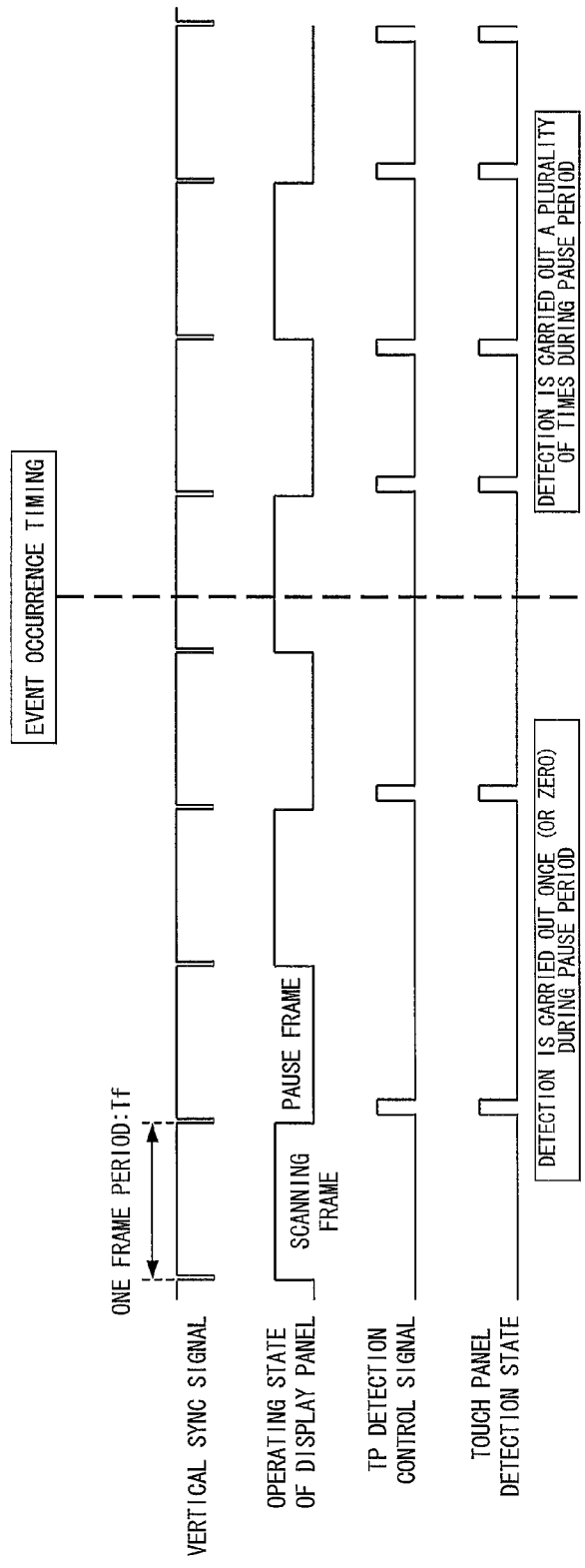

FIG. 14 is a timing diagram which is obtained in a case where the number of times of detection by the detecting section illustrated in FIG. 13 is increased and which illustrates a relationship among a vertical sync signal, an operating state of a display panel, a TP detection control signal, and a detection state of a detecting section.

Figure 15:
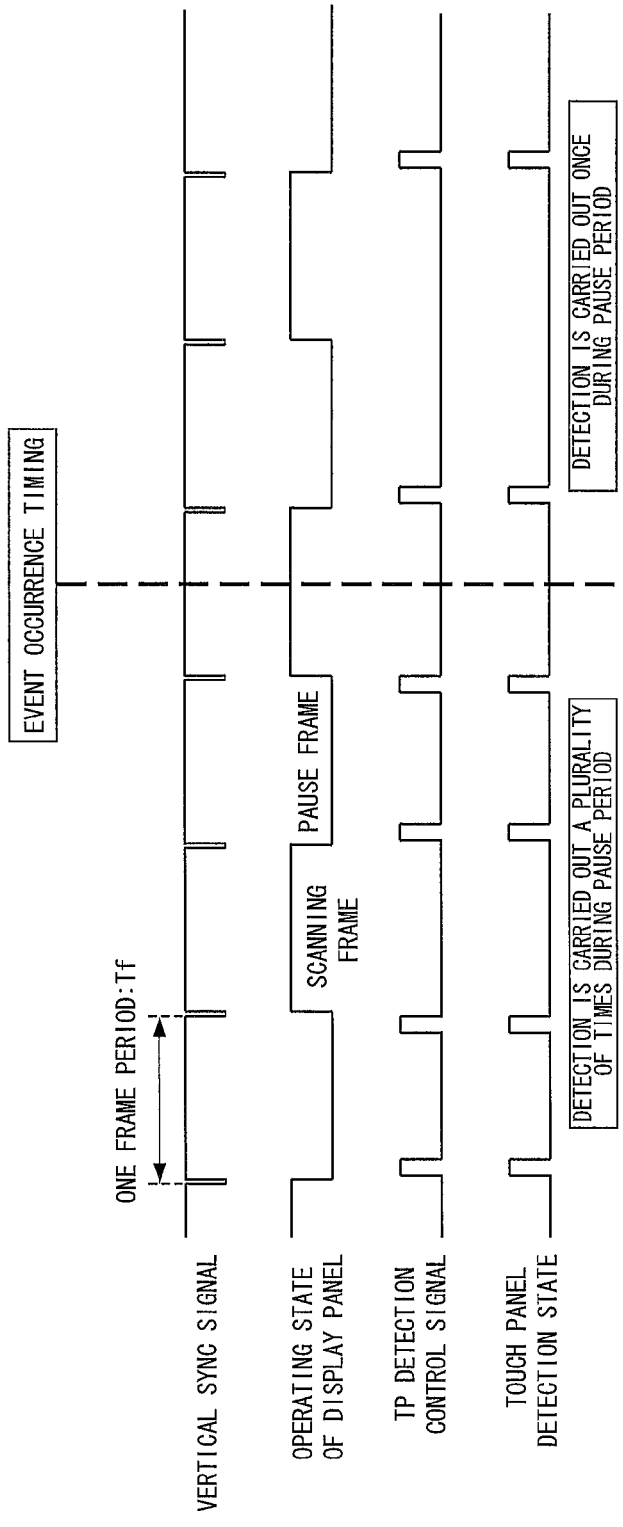

FIG. 15 is a timing diagram which is obtained in a case where the number of times of detection by the detecting section illustrated in FIG. 13 is decreased and which illustrates a relationship among the vertical sync signal, an operating state of the display panel, the TP detection control signal, and a detection state of the detecting section.

Figure 16:
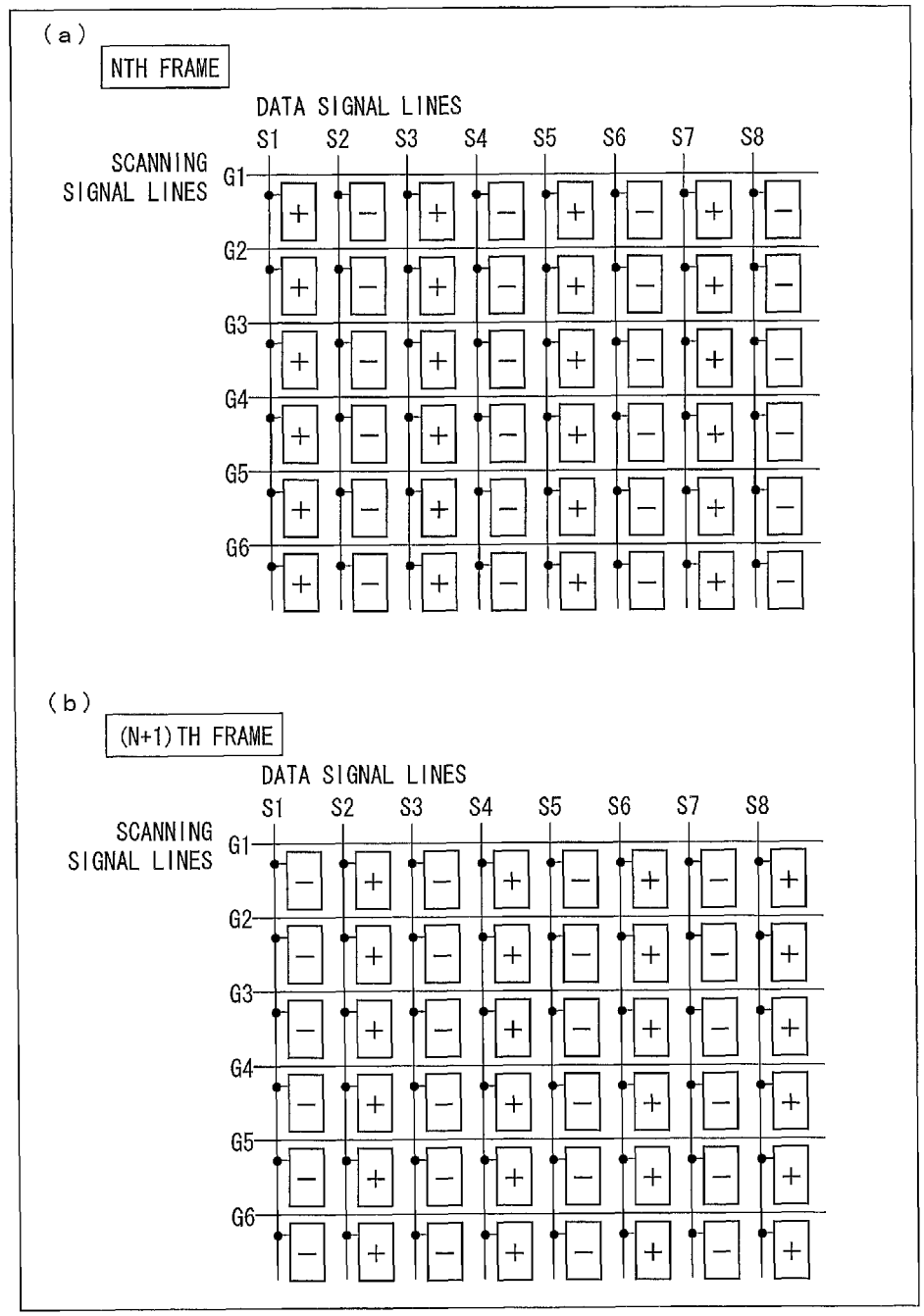

(a) of FIG. 16 is an explanatory diagram illustrating a polarity state of the nth frame in a case where reverse polarity driving of the display panel illustrated in FIG. 1 is carried out by source inversion. (b) of FIG. 16 is an explanatory diagram illustrating a polarity state of the (n+1)th frame under the same condition.

Figure 17:
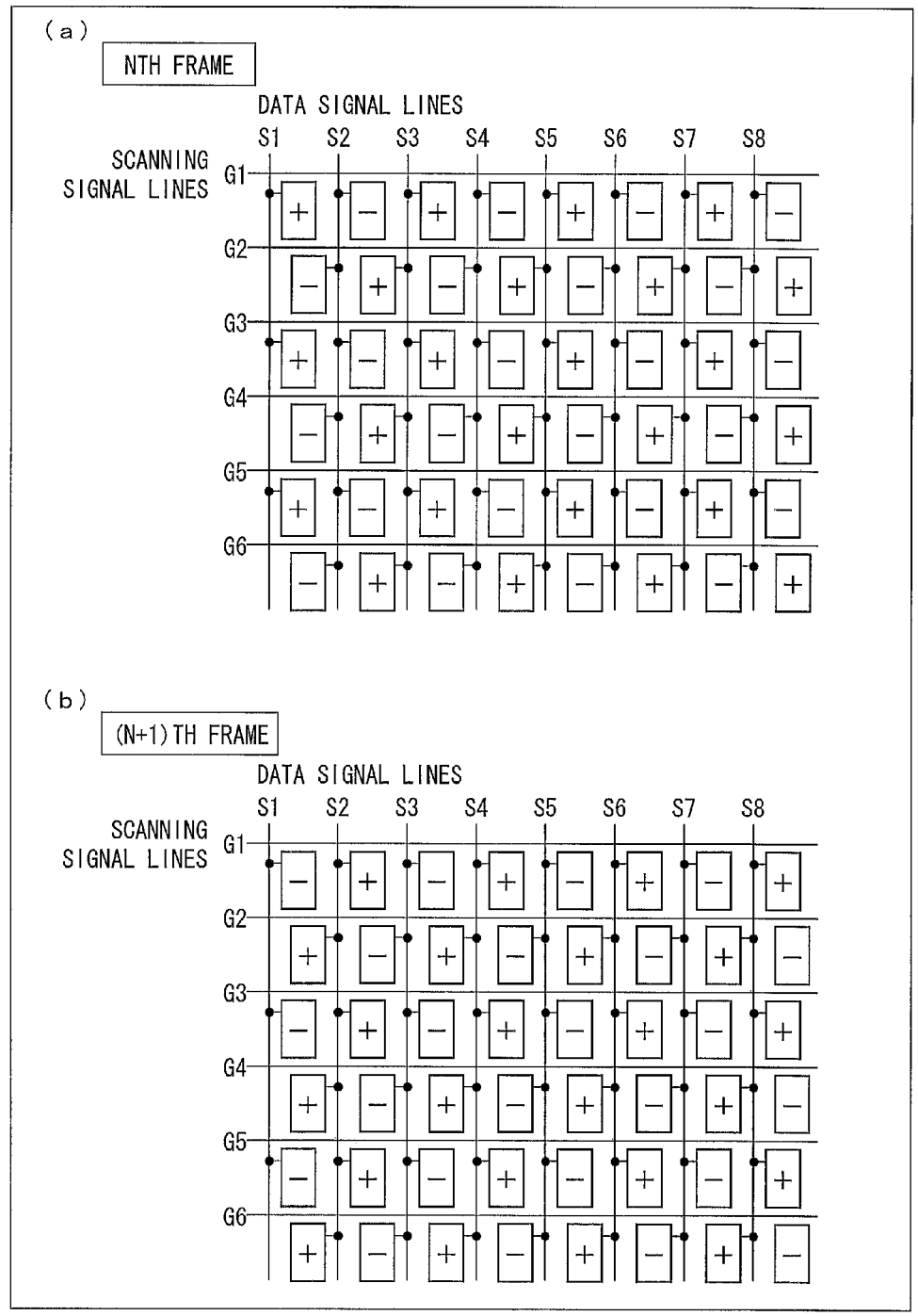

(a) of FIG. 17 is an explanatory diagram illustrating a polarity state of the nth frame in a case where the reverse polarity driving of the display panel illustrated in FIG. 1 is carried out by the source inversion and arrangement of pixels is different from that illustrated in (a) of FIG. 16. (b) of FIG. 17 is an explanatory diagram illustrating a polarity state of the (n+1)th frame under the same condition.

Figure 18:
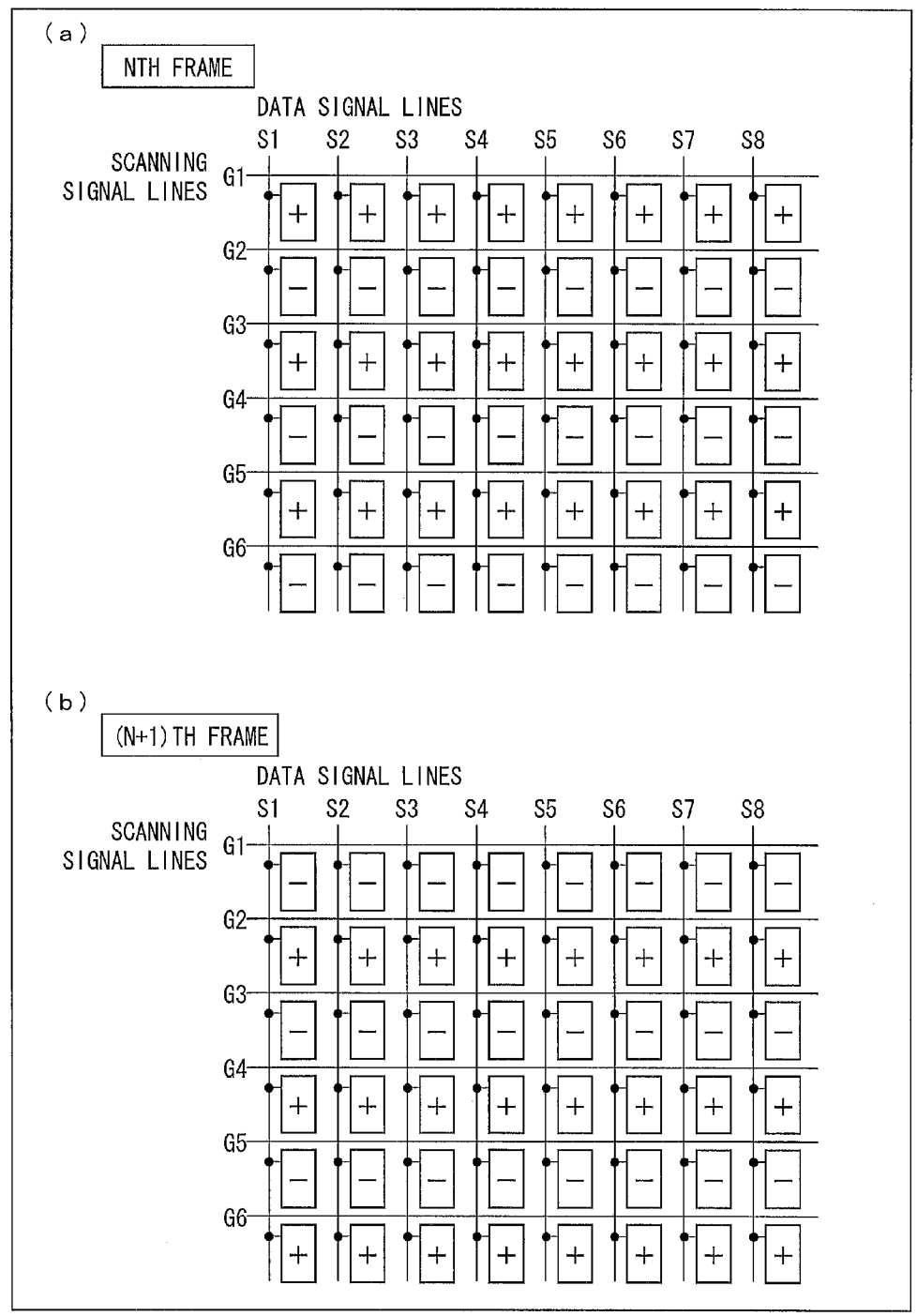

(a) of FIG. 18 is an explanatory diagram illustrating a polarity state of the nth frame in a case where the reverse polarity driving of the display panel illustrated in FIG. 1 is carried out by line inversion. (b) of FIG. 18 is an explanatory diagram illustrating a polarity state of the (n+1)th frame under the same condition.

Figure 19:
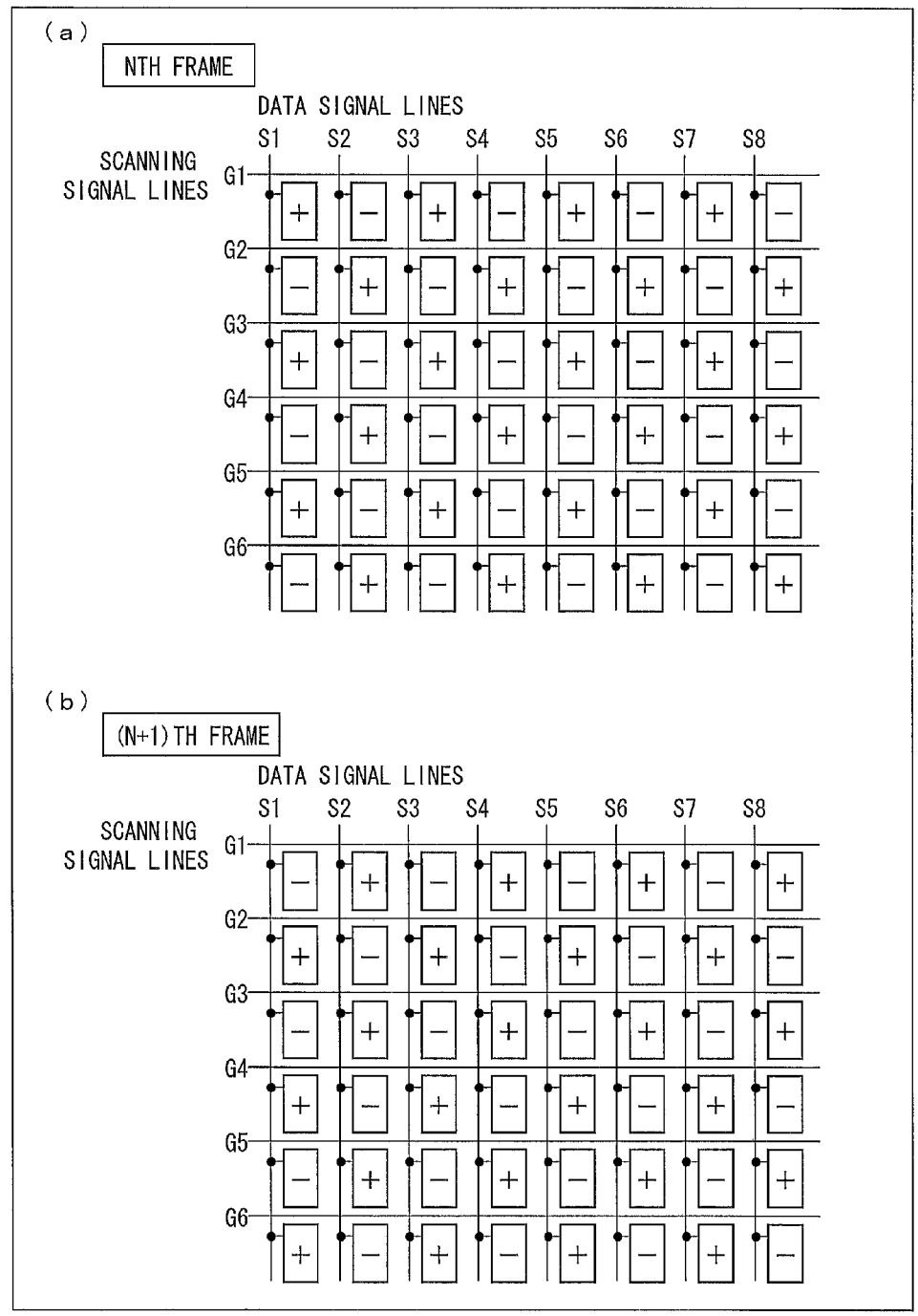

(a) of FIG. 19 is an explanatory diagram illustrating a polarity state of the nth frame in a case where the reverse polarity driving of the display panel illustrated in FIG. 1 is carried out by dot inversion. (b) of FIG. 19 is an explanatory diagram illustrating a polarity state of the (n+1)th frame under the same condition.

Figure 20:
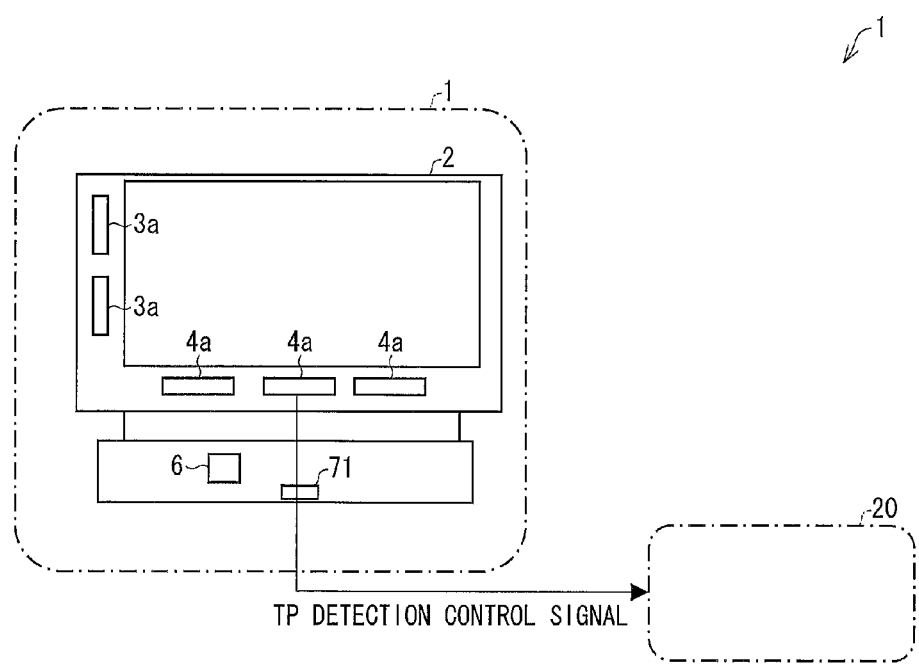

FIG. 20 is an explanatory diagram illustrating another configuration example of the display device illustrated in FIG. 1.

DESCRIPTION OF EMBODIMENTS

[Embodiment 1]

The following description will discuss an embodiment of the present invention with reference to the drawings.

(Description of Configuration of Electronic Apparatus)

FIG. 1 is an explanatory diagram illustrating a configuration of electronic apparatus 100 in accordance with Embodiment 1 of the present invention. Examples of the electronic apparatus 100 include a mobile phone, a smart phone, a laptop personal computer, various tablet information terminal devices, and a display device such as an organic EL device and a liquid crystal display device.

The electronic apparatus 100 includes a display device 1, a detecting device 20, and a system side control section (a control section, a first control section) 30 (see FIG. 1).

The display device 1 includes a display panel 2, a scanning line drive circuit (a gate driver) 3, a signal line drive circuit (a source driver) 4, a common electrode drive circuit 5, and a timing control section (a control section, a second control section) 6.

The display panel 2 includes (i) a plurality of pixels arranged in a matrix pattern, (ii) N (N is any integer) scanning signal lines G (gate lines), and (iii) M (M is any integer) data signal lines S (source lines). The scanning signal lines G and the data signal lines S intersect with each other at right angles. The scanning signal lines G are provided so that the plurality of pixels is scanned while being line-sequentially selected. The data signal lines S are provided so that a data signal is supplied to pixels which belong to a selected line of the scanning signal lines G. Further, the display panel 2 includes a common electrode (not illustrated) provided for each of the plurality of pixels.

Note that G(n) illustrated in FIG. 1 indicates the nth (n is any integer) scanning signal line G. For example, the scanning signal lines G(1), G(2), and G(3) indicate the respective first, second, and third scanning signal lines G. On the other hand, the data signal line S(i) indicates the ith (i is any integer) data signal line S. For example, the data signal lines S(1), S(2), and S(3) indicates the respective first, second, and third data signal lines S.

The scanning line drive circuit 3 line-sequentially scans the scanning signal lines G of the display panel 2 from G(1) to G(n). While line-sequentially scanning the scanning signal lines G, the scanning line drive circuit 3 supplies, to each of the scanning signal lines G, a rectangular wave for turning on switching elements (TFTs) which are provided to respective pixels and connected to respective pixel electrodes. This causes pixels belonging to a line of the scanning signal lines G of the display panel 2 to be selected.

The signal line drive circuit 4 (i) calculates, in accordance with a video signal supplied from the timing control section 6 (see an arrow D shown in FIG. 1), a value of a voltage to be supplied to each of the pixels belonging to the selected line of the scanning signal lines G and (ii) then supplies, to each of the data signal lines S, the voltage having the value. As a result, image data is supplied to the each of the pixels belonging to the selected line of the scanning signal lines G.

The common electrode drive circuit 5 supplies, to the common electrode of the display panel 2, a predetermined common voltage for driving the common electrode, in accordance with a reverse polarity signal supplied from the timing control section 6 (see an arrow E shown in FIG. 1).

The timing control section 6 receives, from the system side control section 30, the video signal (see an arrow A in FIG. 1), a video clock, and a horizontal sync signal (Hsync) and a vertical sync signal (Vsync) each serving as a sync signal (see an arrow B shown in FIG. 1). Note that the timing control section 6 and the system side control section 30 communicate with each other in accordance with a serial I/F signal (see an arrow C shown in FIG. 1).

The timing control section 6 generates, in accordance with the signals thus received, a horizontal sync control signal (e.g., GCK) and a vertical sync control signal (e.g., GSP) each serving as a video image sync signal, which is a standard by which circuits of the display device 1 operate in sync with each other. The timing control section 6 supplies the horizontal sync control signal and the vertical sync control signal to each of the scanning line drive circuit 3 and the signal line drive circuit 4 (see arrows F and G shown in FIG. 1).

Specifically, the timing control section 6 supplies, to the scanning line drive circuit 3, a gate start pulse signal, a gate clock signal, and a gate output enable signal. Further, the timing control section 6 supplies, to the signal line drive circuit 4, a source start pulse signal, a source latch strobe signal, a source clock signal, and the video signal corresponding to an input image.

Furthermore, the timing control section 6 supplies an pause drive control signal to each of the scanning line drive circuit 3 and the signal line drive circuit 4 (see arrows H and I shown in FIG. 1). The pause drive control signal instructs the scanning line drive circuit 3 and the signal line drive circuit 4 to stop operating. A period specified by the pause drive control signal is a non-scanning period (pause period).

Moreover, the timing control section 6 supplies, to the detecting device 20, a TP detection control signal corresponding to the pause drive control signal (see an arrow J shown in FIG. 1). The detecting device 20 detects, in accordance with a timing (the number of times) specified by the TP detection control signal, an input operation carried out with respect to the detecting device 20.

The horizontal sync control signal is used as an output timing signal which controls a timing at which the signal line drive circuit 4 supplies the video signal to the display panel 2. Further, the horizontal sync control signal is used as a timing signal which controls a timing at which the scanning line drive circuit 3 supplies a scanning signal to the display panel 2. Meanwhile, the vertical sync control signal is used as a timing signal which controls a timing at which the scanning line drive circuit 3 starts scanning the scanning signal lines G.

Note that, unless otherwise noted, "one vertical period" and "one horizontal period" herein refer to (i) a period specified by the vertical sync control signal and (ii) a period specified by the horizontal sync control signal, respectively.

In accordance with the horizontal sync control signal and the vertical sync control signal which have been received from the timing control section 6, the scanning line drive circuit 3 starts scanning the display panel 2 so as to supply the scanning signal to each of the scanning signal lines G while sequentially selecting the scanning signal lines G.

In accordance with the horizontal sync control signal received from the timing control section 6, the signal line drive circuit 4 writes, to each of the data signal lines S of the display panel 2, the image data based on the video signal.

Note that a voltage necessary for driving or operating each of the circuits is supplied from a voltage source generating circuit (not illustrated) to the each of the circuits of the display device 1.

(Description of Detecting Device)

The detecting device 20 is connected to each of the timing control section 6 of the display device 1 and the system side control section 30 so as to communicate with each other (see FIG. 1). The detecting device 20 includes a detecting section 21 and a detecting section control section 22. The detecting section 21 detects an input operation carried out by a user with respect to the electronic apparatus 100. The detecting section control section 22 controls such detection by the detecting section 21.

According to Embodiment 1, the detecting device 20 is a touch panel such as a matrix capacitance touch panel. The detecting section 21 constituting the touch panel is provided on a display screen of the display panel 2. Note that the input operation with respect to the detecting device 20 is a contact (touch) operation carried out with respect to the touch panel. The detecting section 21 detects whether or not the contact operation with a finger of the user, a pen, or the like has been carried out with respect to the touch panel.

The detecting section control section 22 receives the TP detection control signal from the timing control section 6. The TP detection control signal is a signal which controls the detection by the detecting section 21 of the input operation (TP operation) carried out with respect to the detecting device 20. Specifically, the detecting section control section 22 which has received the TP detection control signal causes the detecting section 21 to detect, in sync with the TP detection control signal, the input operation carried out with respect to the detecting device 20. The detecting section control section 22 then supplies, to the system side control section 30, data showing, as detection data, a result of the detection by the detecting section 21 (see an arrow K in FIG. 1).

(Description of System Side Control Section)

The system side control section 30 is provided on, for example, a system side substrate of the electronic apparatus 100. The system side control section 30 includes (i) a CPU (Central Processing Unit) which executes a command of a control program that carries out each function of the electronic apparatus 100, (ii) a ROM (Read Only Memory) in which the control program is stored, (iii) a RAM (Random Access Memory) which extracts the control program, and (iv) a storage section such as a memory in which the control program and various sets of data are stored. The system side control section 30 thus configured integrally controls the electronic apparatus 100.

FIG. 2 is a block diagram illustrating a configuration of the system side control section 30 illustrated in FIG. 1. In a case where the CPU executes a given program stored in the storage section, the system side control section 30 functions as a state change detecting section 31, a TP detection control section (a control section) 32, an video signal output section 33, a video clock/sync signal output section 34, and an input operation analyzing section 35 (see FIG. 2).

In accordance with the detection data received from the detecting section control section 22 of the detecting device 20, the state change detecting section 31 detects, as a state change of the electronic apparatus 100, whether or not the input operation with respect to the detecting device 20 has been changed between an input operation with a human finger and an input operation with a pen.

In a case where the state change detecting section 31 detects that the input operation with respect to the detecting device 20 has been changed from the input operation with the human finger to the input operation with the pen (the state change), the TP detection control section (a control section, a first control section) 32 supplies, to the timing control section 6, a control signal which instructs the detecting section 21 of the detecting device 20 to carry out the detection more times. Meanwhile, in a case where the state change detecting section 31 detects that the input operation with respect to the detecting device 20 has been changed from the input operation with the pen to the input operation with the human finger (the state change), the TP detection control section 32 supplies, to the timing control section 6, a control signal which instructs the detecting section 21 of the detecting device 20 to carry out the detection fewer times.

The video signal output section 33 supplies the video signal to the timing control section 6. The video clock/sync signal output section 34 supplies, to the timing control section 6, the horizontal sync signal Hsync, the vertical sync signal Vsync, and the video clock.

The input operation analyzing section 35 analyzes, in accordance with the detection data received from the detecting section control section 22, contents of an instruction on the input operation carried out with respect to the detecting device 20. The system side control section 30 controls the electronic apparatus 100 so that an operation instructed by the input operation is carried out.

(Electric Power Consumption of Conventional Display Device)

Here, the following description will discuss a problem of electric power consumption which problem occurs in a conventional display device. (a) of FIG. 3 is a view illustrating an internal configuration of an output part of a signal line drive circuit 106. (b) of FIG. 3 is a view illustrating a waveform of a consumption electric current (I(Vdd)) of the signal line drive circuit 106. In a case where a display device having a general resolution of WSVGA (1024RGB×600) is taken as an example, the signal line drive circuit 106 of such a display device needs to have 1024×3 (RGB)=3072 analog amplifiers 118. Each of the analog amplifiers 118 is an element which supplies a data signal to a corresponding one of the data signal lines S. A constant stationary electric current of approximately 0.01 mA flows through each of the analog amplifiers 118 so that an output capability of the each of the analog amplifiers 118 is secured.

Therefore, the 3072 analog amplifiers 118 have the constant stationary electric current of approximately 30.7 mA in total. A voltage source (Vdd) supplied to the signal line drive circuit 106 is normally approximately 10 V. Therefore, the signal line drive circuit consumes electric power of 10 V×30.7 mA=307 mW. As a result, an average consumption electric current has a value indicated by an arrow P2 illustrated in (b) of FIG. 3. The average consumption electric current of this value accounts for a large part of the electric power consumption of the entire display device. This is one of major causes which prevent the display device from consuming less electric power.

(Electric Power Consumption of Display Device of Embodiment 1)

The display device 1 of Embodiment 1 operates while consuming less average electric power than the conventional display device. The following description will discuss this point.

<Operation of Analog Amplifier>

First, the following description will discuss analog amplifiers (output circuits) 18 of the signal line drive circuit 4. (a) of FIG. 4 is a view illustrating an internal configuration, particularly, an output part of the signal line drive circuit 4. (b) of FIG. 4 is a view illustrating a waveform of an AMP_Enable signal. The AMP_Enable signal corresponds to the pause drive control signal.

The analog amplifiers 18 of the signal line drive circuit 4 are provided so as to correspond to the respective data signal lines S (see (a) of FIG. 4). Therefore, the signal line drive circuit 4 of Embodiment 1 includes the analog amplifiers 18, whose number is M. That is, the number of the analog amplifiers 18 is equal to that of the data signal lines S.

The signal line drive circuit 4 further includes an AMP_Enable signal line for supplying the AMP_Enable signal to each of the analog amplifiers 18. The AMP_Enable signal line is connected to the timing control section 6. Further, in the signal line drive circuit 4, the AMP_Enable signal line is connected in parallel to each of the analog amplifiers 18.

Vdd is a voltage supplied from the voltage source generating circuit. The signal line drive circuit 4 and each of the analog amplifiers 18 operate in response to Vdd.

At a predetermined timing, the timing control section 6 supplies, to each of the analog amplifiers 18 of the signal line drive circuit 4, the AMP_Enable signal, which is a control signal that specifies an operating state of the each of the analog amplifiers 18. Each of the analog amplifiers 18 operates in a case where the AMP_Enable signal has an H value, and stops operating in a case where the AMP_Enable signal has an L value.

While the display panel 1 is driving the display panel 2, one vertical period specified by the vertical sync control signal is divided into a scanning period and the non-scanning period. The timing control section 6 sets the AMP_Enable signal to the H value during the scanning period so that each of the analog amplifiers 18 operates (see (b) of FIG. 4). Meanwhile, the timing control section 6 sets the AMP_Enables signal to the L value during the non-scanning period so that each of the analog amplifiers 18 stops operating.

<Signal Waveform>

Next, the following description will discuss waveforms of various signals which waveforms are obtained while the display panel 2 is being driven. FIG. 5 is a view illustrating various signal waveforms which waveforms are obtained while the display panel 2 of the display device 1 is being driven.

An upper part of FIG. 5 illustrates input signals supplied to the timing control section 6 and a memory (not illustrated). For example, the timing control section 6 receives the vertical sync signal (Vsync) and the horizontal sync signal (Hsync) as input video sync signals. Further, while the timing control section 6 receives the input video sync signal, the memory (not illustrated) receives an input video signal. A period during which the input video signal causes the image data for one frame to be written to the memory corresponds to a cycle of Vsync.

Further, a lower part of FIG. 5 illustrates output signals which are outputted by the timing control section 6 and the memory (not illustrated).

For example, the timing control section 6 generates, in accordance with the received input video sync signal, the horizontal sync control signal and the vertical sync control signal each serving as the video sync signal, which is a standard by which the circuits of the display device 1 operate in sync with each other. Note here that the timing control section 6 generates (i) the vertical sync control signal having a cycle identical to that of the received Vsync and (ii) the horizontal sync control signal having a cycle shorter than that of the received Hsync. According to FIG. 5, the cycle of the generated horizontal sync control signal corresponds to one third of the cycle of Hsync. The timing control section 6 supplies, as image sync signals, the generated horizontal sync control signal and the generated vertical sync control signal to each of the scanning line drive circuit 3, the signal line drive circuit 4, and the memory (not illustrated).

Note here that, since the cycle of the horizontal sync control signal is short, within one vertical period, scanning for one frame is carried out during a period (scanning period) shorter than the one vertical period. Note that the cycle of the horizontal sync control signal is not limited to the one illustrated in FIG. 5. For example, the cycle of the horizontal sync control signal is preferably an integral submultiple of the cycle of Hsync, that is, a frequency of the horizontal sync control signal is preferably an integral multiple of that of Hsync.

The memory (not illustrated) outputs, based on the input video signal stored therein, the video signal in accordance with the received vertical sync control signal and the received horizontal sync control signal. An image data transfer period during which the video signal causes the image data for one frame to be transferred corresponds to the scanning period. The timing control section 6 outputs the AMP_Enable signal in sync with the generated vertical sync control signal and the generated horizontal sync control signal. Further, the signal line drive circuit 4 supplies the data signal to each of the data signal lines S while the AMP_Enable signal is maintaining the H value.

Note that the description of Embodiment 1 assumes that the memory is provided outside the timing control section 6. However, the memory can be provided in the timing control section 6.

<Driving of Display Panel 2>

The following description will discuss driving of the display panel 2 which is controlled by the various signals described earlier.

According to the display device 1, the vertical sync control signal is supplied for each vertical period. First, the timing control section 6 changes a voltage of the AMP_Enable signal from the L value to the H value in sync with the vertical sync control signal. This causes a change in state of the analog amplifiers 18 of the signal line drive circuit 4 from a non-operating state to an operating state (normal state).

Next, the scanning line drive circuit 3 supplies the scanning signal to the first scanning signal line G in sync with the vertical sync control signal and the horizontal sync control signal. This causes a state of gates of TFTs of pixels which are connected to the scanning signal line G(1) to be an on-state.

Next, in sync with the horizontal sync control signal, the signal line drive circuit 4 supplies, to each of the data signal lines S, the data signal via a corresponding analog amplifier 18 which is connected to the each of the data signal lines S. This causes a voltage necessary for a display to be supplied to the each of the data signal lines S. Accordingly, the voltage necessary for a display is written, via the TFTs, to pixel electrodes belonging to the scanning signal line G(1). In a case where the writing is completed, the state of the gates of the TFTs of the pixels which are connected to the scanning signal line G(1) returns from the on-state to an off-state.

After the first one horizontal period elapses, the next horizontal sync control signal is inputted. Pixels which are connected to the second and later scanning signal lines G are subjected to the writing by a process similar to that by which the writing is carried out with respect to the pixels which are connected to the first scanning signal line G. A period during which the writing is thus carried out with respect to the pixels connected to all the N scanning signal lines G is referred to as a writing period. The writing period is a period identical to the scanning period. The AMP_Enable signal maintains the H value during the writing period.

After the writing period (scanning period) elapses in the first vertical period, the timing control section 6 changes a voltage of the AMP_Enable signal from the H value to the L value. This causes the state of the analog amplifiers 18 to be the non-operating state.

After the first one vertical period elapses, the next vertical sync control signal is inputted. The second and later frames are driven by a process similar to the above process.

Note that during a period in which the analog amplifiers 18 are in the non-operating state, the data signal line S(i) and an output of a corresponding one of the analog amplifiers 18 are disconnected from each other. The data signal line S(i) can be electrically floated, or can be connected to Vdd or the like.

According to the above configuration, the stationary electric current of each of the analog amplifiers 18 is cut off during the non-scanning period. This causes an average consumption electric current to have a value indicated by an arrow P1 illustrated in (b) of FIG. 4. This value is considerably smaller than that of the average consumption electric current (the arrow P2 illustrated in (b) of FIG. 3) of the conventional display device. Further, since the pause period is integrated into one vertical period, it is possible to save, as much as possible, an electric current which momentarily flows at a switch between the scanning period and the pause period. Therefore, the display device 1 can further reduce electric power consumption than the conventional display device.

(Description of Detection by Detecting Device)

Next, the following description will discuss the detection by the detecting device 20 of the input operation carried out by the user.

FIG. 6 is a timing diagram which is obtained in a case where the number of times of the detection by the detecting section 21 is increased and which illustrates a relationship among the vertical sync signal, an operating state of the display panel, the TP detection control signal, and a detection state of the detecting section 21 (a touch panel detection state). FIG. 7 is a timing diagram which is obtained in a case where the number of times of the detection by the detecting section 21 is decreased and which illustrates a relationship among the vertical sync signal, an operating state of the display panel, the TP detection control signal, and a detection state of the detecting section 21 (a touch panel detection state).

According to the electronic apparatus 100 of Embodiment 1, the scanning period, during which the image data is written to the pixel electrodes of the display panel 2, and the non-scanning period (the pause period), during which the image data is not written to the pixel electrodes, are alternately repeated (see FIGS. 6 and 7). Specifically, according to examples illustrated in FIGS. 6 and 7, a scanning frame (the scanning period) and a pause frame (the non-scanning period, the pause period) alternately change in sync with the vertical sync signal. The detection of the input operation carried out by the user with respect to the detecting device 20 is carried out during the non-scanning period (pause period).

The detection of the input operation carried out by the user is carried out during the pause period due to the following reason. That is, in a case where scanning is carried out in the display device 1 (the display panel 2) so that the image data is displayed, a noise is produced from the display device 1. The noise adversely influences detection accuracy of the detecting device 20, particularly of the capacitance touch panel. Therefore, the detection carried out during the scanning period of the display device 1 causes a deterioration in detection accuracy of the detecting device 20. In view of the circumstances, according to the electronic apparatus 100, in order not to be influenced by the noise, the detecting device 20 carries out the detection during the non-scanning period (the pause period) of the display device 1 in which period no noise is produced.

With the configuration, the electronic apparatus 100 allows an improvement in detection accuracy of the detecting device 20.

The detecting section 21 of the detecting device 20 detects whether or not the input operation is carried out with respect to the detecting device 20. The detection by the detecting section 21 is controlled by the TP detection control section 32 of the system side control section 30 and the timing control section 6 of the display device 1.

Specifically, a timing and the number of times of the detection by the detecting section 21 are set by the detecting section control section 22 in accordance with the TP detection control signal supplied from the timing control section 6 to the detecting section control section 22. In accordance with the control signal (detection number-of-times control signal) supplied from the TP detection control section 32, the timing control section 6 supplies, to the detecting section control section 22, the TP detection control signal indicative of the timing and the number of times of the detection by the detecting section 21. The TP detection control section 32 supplies, to the timing control section 6, the control signal indicative of the number of times of the detection by the detecting section 21.

In this case, in accordance with a detection signal from the state change detecting section 31, the TP detection control section 32 controls the number of times of the detection by the detecting section 21.

The state change detecting section 31 detects a state change of the electronic apparatus 100 which state change causes a change in detection accuracy which the detecting device 20 is required to have so as to detect the input operation. According to Embodiment 1, in accordance with the detection data from the detecting device 20, the state change detecting section 31 detects, as the state change, whether or not the input operation with respect to the detecting device 20 has been changed between the input operation with the finger and the input operation with the pen.

That is, in the case of the input operation with the finger, the detecting device 20 is required to detect the input operation with relatively low accuracy because a surface of the detecting device 20 is operated (scanned) by the finger having a large width. Meanwhile, in the case of the input operation with the pen, the detecting device 20 is required to detect the input operation with relatively high accuracy because the surface of the detecting device 20 is operated (scanned) by the pen having a tip narrower than the finger.

Specifically, every time the input operation is carried out, the state change detecting section 31 determines, in accordance with the detection data from the detecting device 20, whether the input operation has been carried out with respect to the detecting device 20 with the finger or the pen, and then stores a result of the determination. Next, the state change detecting section 31 compares results of the determination of the input operation for this time and the previous time, so as to determine whether or not the input operation has been changed from/to the input operation with the finger to/from the input operation with the pen. As a result of the determination by the state change detecting section 31, in a case where the input operation has been changed from/to the input operation with the finger to/from the input operation with the pen, the state change detecting section 31 transmits, to the TP detection control section 32, the change as a result of the detection of the state change.

In a case where the state change detecting section 31 detects that the input operation with respect to the detecting device 20 has been changed from the input operation with the finger to the input operation with the pen, the TP detection control section 32 supplies, to the timing control section 6, the control signal which instructs the detecting section 21 to carry out the detection more times. This is because the detecting device 20 is required to detect the input operation with relatively high accuracy.

With this configuration, the number of times of the detection by the detecting section 21 of the input operation during the non-scanning period (pause period) is increased, for example, from once or zero (as illustrated in the left part of FIG. 6) to twice (as illustrated in the right part of FIG. 6) (see FIG. 6). As a result, also in a case where the input operation with respect to the detecting device 20 has been changed from the input operation with the finger to the input operation with the pen, it is possible to detect the input operation with respect to the detecting device 20 with high accuracy.

Meanwhile, in a case where the state change detecting section 31 detects that the input operation with respect to the detecting device 20 has been changed from the input operation with the pen to the input operation with the finger, the TP detection control section 32 supplies, to the timing control section 6, the control signal which instructs the detecting section 21 to carry out the detection fewer times. This is because the detecting device 20 is required to detect the input operation with relatively low accuracy.

With this configuration, the number of times of the detection by the detection section 21 of the input operation during the non-scanning period (pause period) is decreased, for example, from twice (as illustrated in the left part of FIG. 7) to once or zero (as illustrated in the right part of FIG. 7) (see FIG. 7). As a result, also in a case where an input operation which allows the detecting device 20 to carry out the detection with high accuracy (the input operation with the finger) is carried out with respect to the detecting device 20, it is possible to prevent an increase in electric power consumption due to wasteful detection.

Note that a state in which the number of times of the detection is zero (see the left part of FIG. 6 and the right part of FIG. 7) is not a state in which the detecting section 21 does not detect the input operation at all, but a state in which the detecting section 21 can detect the input operation, e.g., the detecting section 21 does not carry out the detection for each pause frame but carries out the detection every two or more pause frames. On this point, same applies to the other embodiments.

Note also that, according to the examples illustrated in FIGS. 6 and 7, the number of times of the detection by the detecting section 21 during the non-scanning period (pause period) is twice in a case where the input operation with respect to the detecting device 20 is carried out with the pen. However, the present embodiment is not limited to this. That is, it is only necessary that, during the non-scanning period (pause period), the detecting section 21 carry out the detection more times in a case where the input operation with respect to the detecting device 20 is carried out with the pen than in a case where the input operation with respect to the detecting device 20 is carried out with the finger.

Further, according to the examples illustrated in FIGS. 6 and 7, the detecting section 21 carries out the detection a plurality of times right after the pause frame (pause period) is started and right before the pause frame (pause period) is ended, respectively. However, the present embodiment is not limited to this. It is only necessary that the detecting section 21 carry out the detection the plurality of times during the pause period. On this point, same applies to the other embodiments.

Further, according to the above examples, the detecting section 21 carries out the detection more or fewer times during the non-scanning period (pause period) of the display device 1 in a case where the input operation with respect to the detecting device 20 is changed between the input operation with the finger and the input operation with the pen. However, for example, the detecting section 21 can carry out the detection more times in a case where the input operation with the finger is carried out at a high speed not less than a threshold, whereas the detecting section 21 can carry out the detection fewer times in a case where the input operation with the finger is carried out at a low speed less than the threshold.

Further, the electronic apparatus 100 illustrated in FIG. 1 is configured such that the timing control section 6 supplies the TP detection control signal directly to the detecting section control section 22 of the detecting device 20. According to the configuration, the timing at which the detecting section 21 carries out the detection is set in accordance with the TP detection control signal from the timing control section 6 which best recognizes the scanning period and the non-scanning period (pause period) of the display device 1. Therefore, it is possible to most accurately set the timing at which the detecting section 21 carries out the detection during the non-scanning period (pause period).

Alternatively, the electronic apparatus 100 can be configured such that the timing control section 6 supplies the TP detection control signal via the system side control section 30 to the detecting section control section 22 of the detecting device 20. Specifically, an electronic apparatus 101 illustrated in FIG. 8 can be configured such that the timing control section 6 supplies a TP detection control signal (1) in accordance with the pause drive control signal to the TP detection control section 32 of the system side control section 30 and then the TP detection control section 32 supplies a TP detection control signal (2) to the detecting section control section 22. On the point that the TP detection control signal can thus be supplied to the detecting device 20 as illustrated in FIG. 8, same applies to electronic apparatuses of the other embodiments.

Further, according to the above examples, the state change detecting section 31 detects, as the state change, that the input operation with respect to the detecting device 20 has been changed between the input operation with the finger and the input operation with the pen. However, the state change detecting section 31 can detect, as the state change, that a width of a contact with the detecting device 20 has been changed between a broad width and a narrow width. In this case, the TP detection control section 32 controls the detecting section 21 to carry out the detection more times in a case where the state change detecting section 31 detects that the width of the contact has been changed from the broad width to the narrow width. Meanwhile, the TP detection control section controls the detecting section 21 to carry out the detection fewer times in a case where the state change control section 31 detects that the width of the contact has been changed from the narrow width to the broad width.

[Embodiment 2]

The following description will discuss a second embodiment with reference to the drawings.

An electronic apparatus 102 of Embodiment 2 has a configuration illustrated in FIG. 1, and a system side control section 30 of the electronic apparatus 102 has a configuration illustrated in FIG. 9.

(Description of system side control section)

As illustrated in FIG. 9, the system side control section 30 includes a state change detecting section 41 serving as means for detecting a state change of the electronic apparatus 102 causing a change in detection accuracy which a detecting device 20 is required to have so as to detect an input operation. According to Embodiment 2, the state change detecting section 41 detects whether application software such as a memo pad in which a handwriting input is carried out with respect to the detecting device 20 has been activated or ended in the electronic apparatus 102, that is, whether an operational mode in which a handwriting input is carried out with respect to the detecting device 20 (hereinafter, referred to as a handwriting input mode) has been activated or ended.

In the handwriting input mode such as the memo pad, the input operation is carried out with respect to the detecting device 20 at a high speed due to the handwriting input. Therefore, the detecting device 20 is required to detect the input operation with relatively high accuracy. Meanwhile, in a case where the handwriting mode is ended, the detecting device 20 is required to detect the input operation with relatively low accuracy.

A TP detection control section 32 supplies, to a timing control section 6, a control signal which, in a case where the state change detecting section 41 detects that the handwriting mode has been activated (a state change) in the electronic apparatus 102, instructs a detecting section 21 of the detecting device 20 to carry out the detection more times. Meanwhile, the TP detection control section 32 supplies, to the timing control section 6, a control signal which, in a case where the state change detecting section 41 detects that the handwriting mode has been ended (a state change) in the electronic apparatus 102, instructs the detecting section 21 of the detecting device 20 to carry out the detection fewer times. The other configurations of the system side control section 30 are similar to those of the system side control section 30 of Embodiment 1.

(Description of Detection Carried Out by Detecting Device)

The following description will discuss the detection by the detecting device 20 of the input operation carried out by a user.

FIG. 10 is a timing diagram which is obtained in a case where the number of times of the detection by the detecting section 21 is increased and which illustrates a relationship among a vertical sync signal, an operating state of a display panel, a TP detection control signal, and a detection state of the detecting device 20 (a touch panel detection state). FIG. 11 is a timing diagram which is obtained in a case where the number of times of the detection by the detecting section 21 is decreased and which illustrates a relationship among the vertical sync signal, an operating state of the display panel, the TP detection control signal, and a detection state of the detecting section 21 (a touch panel detection state).

According to the electronic apparatus 102 of Embodiment 2, a scanning period, during which image data is written to pixel electrodes of a display panel 2, and a non-scanning period (pause period), during which the image data is not written to the pixel electrodes, are alternately repeated (see FIGS. 10 and 11), as in the case of the electronic apparatus 100. During the non-scanning period (pause period), the detection of the input operation carried out by the user with respect to the detecting device 20 is carried out, as in the case of the electronic apparatus 100.

The detecting section 21 of the detecting device 20 detects whether or not the input operation is carried out with respect to the detecting device 20. The detection by the detecting section 21 is controlled by the TP detection control section 32 of the system side control section 30. In accordance with a detection signal from the state change detecting section 41, the TP detection control section 32 controls the number of times of the detection by the detecting section 21.

The state change detecting section 41 thus detects, as the state change, whether the handwriting mode has been activated or ended in the electronic apparatus 102. A result of the detection carried out by the state change detecting section 41 is supplied to the TP detection control section 32.

In a case where the state change detecting section 41 detects that the handwriting mode has been activated, the TP detection control section 32 supplies, to the timing control section 6, the control signal which instructs the detecting section 21 to carry out the detection more times. This is because the detecting device 20 is required to detect the input operation with relatively high accuracy.

With this configuration, the number of times of the detection by the detecting section 21 of the input operation during the non-scanning period (pause period) is increased, for example, from once or zero (as illustrated in the left part of FIG. 10) to three times (as illustrated in the right part of FIG. 10) (see FIG. 10). As a result, also in the handwriting mode, it is possible to detect the input operation with respect to the detecting device 20 with high accuracy.

Meanwhile, in a case where the state change detecting section 41 detects that the handwriting mode has been ended, the TP detection control section 32 supplies, to the timing control section 6, the control signal which instructs the detecting section 21 to carry out the detection fewer times. This is because the detecting device 20 is required to detect the input operation with relatively low accuracy.

With this configuration, the number of times of the detection by the detection section 21 of the input operation during the non-scanning period (pause period) is decreased, for example, from three times (as illustrated in the left part of FIG. 11) to once or zero (as illustrated in the right part of FIG. 11) (see FIG. 11). As a result, in a state where the detecting device 20 is not necessary to carry out the detection with high accuracy, it is possible to prevent an increase in electric power consumption due to wasteful detection.

Note that according to examples illustrated in FIGS. 10 and 11, the number of times of the detection by the detecting section 21 during the non-scanning period (pause period) is three times in a case where the handwriting mode is active. However, the present embodiment is not limited to this. That is, it is only necessary that, during the non-scanning period (pause period), the detecting section 21 carry out the detection more times in a case where the handwriting mode is active than in a case where the handwriting mode is inactive.

Further, according to the examples illustrated in FIGS. 10 and 11, in an operating state of the display panel which state causes the detecting section 21 to carry out the detection more times during the non-scanning period (pause period) (i.e., a state in which the handwriting mode is active), the scanning period is shorter than one frame period, and the non-scanning period (pause period) is longer than the one frame period. In other words, the scanning period is shorter than the non-scanning period (pause period) in the operating state of the display panel which state causes the detecting section 21 to carry out the detection more times during the non-scanning period (pause period) (i.e., the state in which the handwriting mode is active).

Such a configuration allows a further reduction in electric power consumption of the electronic apparatus 102 during the scanning period. However, the configuration of the electronic apparatus 102 is not limited to this. That is, the scanning period can be equal in length to the non-scanning period (pause period) also in the operating state which causes the detecting section 21 to carry out the detection more times during the non-scanning period (pause period) (i.e., the state in which the hand writing mode is active).

Further, according to Embodiment 2, the operational mode in which the handwriting input is carried out can be activated by changing, to the handwriting mode, a photographic display mode in which a photographic image is displayed.

[Embodiment 3]

The following description will discuss a third embodiment with reference to the drawings.

(Description of Configuration of Electronic Apparatus)

An electronic apparatus 103 of Embodiment 3 has a configuration illustrated in FIG. 12. A path via which TP detection control signals (TP detection control signals (1) and (2)) are transmitted in the electronic apparatus 103 is similar to that via which the TP detection control signal is transmitted in the electronic apparatus 101 illustrated in FIG. 8.

The electronic apparatus 103 includes a temperature sensor section 61. The temperature sensor section 61 includes a temperature sensing section 62 and a temperature data converting section 63. The temperature sensing section 62 detects an ambient temperature of a detecting device 20, and then supplies temperature data thus obtained to the temperature data converting section 63. To a system side control section 30, the temperature data converting section 63 supplies, as detected temperature data, the temperature data obtained by the temperature sensing section 62.

The temperature sensor section 61 is preferably provided near the detecting device 20 of the electronic apparatus 103. For example, assume that (i) the electronic apparatus 103 is a rectangular tablet information terminal device and (ii) the detecting device 20 is provided on a display device 1. In this case, four temperature sensors 61 are preferably provided, for example, along respective four sides of the detecting device 20 having a rectangular shape, that is, around the detecting device 20. Note that the number of temperature sensors 61 is not particularly limited. Further, the temperature sensor section 61 can be configured such that a plurality of temperature sensing sections 62 and one temperature data converting section 63 are provided, and temperature data detected by the plurality of temperature sensing sections 62 are supplied to the one temperature data converting section 63.

(Description of system side control section)

FIG. 13 is a block diagram illustrating a configuration of the system side control section 30 illustrated in FIG. 12. The system side control section 30 includes a state change detecting section 51 serving as means for detecting a state change of the electronic apparatus 103 which state change causes a change in detection accuracy which the detecting device 20 is required to detect an input operation (see FIG. 13).

The state change detecting section 51 receives the detected temperature data from the temperature data converting section 63 of the temperature sensor section 61. The state change detecting section 51 detects, in accordance with the detected temperature data from the temperature data converting section 63, whether the ambient temperature of the detecting device 20 which ambient temperature was within a given temperature range has exceeded the given temperature range or the ambient temperature of the detecting device 20 which ambient temperature was beyond the given temperature range has fallen within the given temperature range.

The given temperature range, in which the detecting device 20 can maintain given detection accuracy, is sets to, for example, a range of 20° C. or more to 30° C. or less. The ambient temperature of the detecting device 20 which ambient temperature exceeds the given temperature range causes a deterioration in given detection accuracy of the detecting device 20.

In a case where the state change detecting section 51 detects that the ambient temperature of the detecting device 20 which ambient temperature was within a given temperature range has exceeded the given temperature range (state change), a TP detection control section 32 supplies, to a timing control section 6, a control signal which instructs a detecting section 21 of the detecting device 20 to carry out the detection more times. Meanwhile, in a case where the state change detecting section 51 detects that the ambient temperature of the detecting device 20 which ambient temperature was beyond the given temperature range has fallen within the given temperature range (state change), the TP detection control section 32 supplies, to the timing control section 6, a control signal which instructs the detecting section 21 of the detecting device 20 to carry out the detection fewer times. The other configurations of the system side control section 30 are similar to those of the system side control section 30 of Embodiment 1.

(Description of Detection Carried Out by the Detecting Device)

Next, the following description will discuss the detection by the detecting device 20 of the input operation carried out by a user.

FIG. 14 is a timing diagram which is obtained in a case where the number of times of the detection by the detecting section 21 is increased and which illustrates a relationship among a vertical sync signal, an operating state of a display panel, a TP detection control signal, and a detection state of the detecting device 20 (a touch panel detection state). FIG. 15 is a timing diagram which is obtained in a case where the number of times of the detection by the detecting section 21 is decreased and which illustrates a relationship among the vertical sync signal, an operating state of the display panel, the TP detection control signal, and a detection state of the detecting section 21 (a touch panel detection state).

According to the electronic apparatus 103 of Embodiment 3, a scanning period, during which image data is written to pixel electrodes of a display panel 2, and a non-scanning period (pause period), during which the image data is not written to the pixel electrodes, are alternately repeated (see FIGS. 14 and 15), as in the case of the electronic apparatus 100. During the non-scanning period (pause period), the detection of the input operation carried out by the user with respect to the detecting device 20 is carried out.

The detecting section 21 of the detecting device 20 detects whether or not the input operation is carried out with respect to the detecting device 20. The detection by the detecting section 21 is controlled by the TP detection control section 32 of the system side control section 30. In accordance with a detection signal from the state change detecting section 51, the TP detection control section 32 controls the number of times of the detection by the detecting section 21.

In a case where the state change detecting section 51 detects that the ambient temperature of the detecting device 20 which ambient temperature was within the given temperature range has exceeded the given temperature range, the TP detection control section 32 supplies, to the timing control section 6, the control signal which instructs the detecting section 21 of the detecting device 20 to carry out the detection more times. This is because the detecting device 20 is required to detect the input operation with relatively high accuracy.

With this configuration, the number of times of the detection by the detecting section 21 of the input operation during the non-scanning period (pause period) is increased, for example, from once or zero (as illustrated in the left part of FIG. 14) to twice (as illustrated in the right part of FIG. 14) (see FIG. 14). As a result, also in a case where (i) the ambient temperature of the detecting device 20 which ambient temperature was within the given temperature range has exceeded the given temperature range and (ii) the detection accuracy of the detecting device 20 is accordingly deteriorated, it is possible to detect the input operation with respect to the detecting device 20 with high accuracy.

Meanwhile, in a case where the state change detecting section 51 detects that the ambient temperature of the detecting device 20 which ambient temperature was beyond the given temperature range has fallen within the given temperature range, the TP detection control section 32 supplies, to the timing control section 6, the control signal which instructs the detecting section 21 of the detecting device 20 to carry out the detection fewer times. This is because the detecting device 20 is required to detect the input operation with relatively low accuracy.

With this configuration, the number of times of the detection by the detection section 21 of the input operation during the non-scanning period (pause period) is decreased, for example, from twice (as illustrated in the left part of FIG. 15) to once or zero (as illustrated in the right part of FIG. 15) (see FIG. 15). As a result, in a case where (i) the ambient temperature of the detecting device 20 which ambient temperature was beyond the given temperature range has fallen within the given temperature range and (ii) the detection accuracy of the detecting device 20 is accordingly increased, it is possible to prevent an increase in electric power consumption due to wasteful detection.

Note that, according to examples illustrated in FIGS. 14 and 15, the number of times of the detection by the detecting section 21 during the non-scanning period (pause period) is twice in a case where the ambient temperature of the detecting device 20 is beyond the given temperature range. However, the present embodiment is not limited to this. That is, it is only necessary that, during the non-scanning period (pause period), the detecting section 21 carry out the detection more times in a case where the ambient temperature of the detecting device 20 is beyond the given temperature range than in a case where the ambient temperature of the detecting device 20 is within the given temperature range.

(Another Configuration Example of Detecting Device)

The embodiments have described the detecting device 20 in which the input operation is carried out by touch scanning with respect to the detecting device 20. However, the detecting device 20 is not limited to this. The detecting device 20 can include, for example, an RF circuit (a high-frequency circuit).

In this case, the detecting device 20 can receive an input signal which is a high frequency signal as an input signal for the detecting device 20. Meanwhile, the detecting device 20 easily suffers a deterioration in detection accuracy because S/N decreases due to noise produced from the display device 1. In view of this, in a case where, for example, the electronic apparatus 100 including the detecting device 20 thus configured is configured such that the number of times of the detection by the detecting device 20 during the non-scanning period is controlled, as described above, in accordance with the state change detected by the state change detecting section 31, it is possible to suitably improve detection accuracy of the detecting device 20 while reducing electric power consumption.

(Description of Reverse Polarity Driving of Display Panel)

The display device 1 described in the embodiments is preferably configured such that polarities of voltages applied to the pixel electrodes of the display panel 2 are reversed a predetermined number of times (for example, once) for each frame period so that an identical image which is displayed at an identical position for a long time is prevented from sticking to a screen. The following description refers to, as "frame inversion", an inversion mode in which application of voltages having identical polarities to all the pixels of the display panel 2 in a first frame and application of voltages having reverse polarities to all the pixels in a second frame following the first frame are repeated. The frame inversion can be carried out by reversing, for each frame period, the polarities of the voltages applied to all the data signal lines S in a frame.

Further, in order to prevent a flicker, it is preferable to reverse polarities of voltages for every pixel electrodes arranged in at least one of a direction in which the scanning signal lines G extend and a direction in which the data signal lines S extend. Examples of such an inversion include "source inversion", "line inversion", and "dot inversion". The following description will discuss these inversions with reference to FIGS. 16 to 19.

Each of FIGS. 16 to 19 is an explanatory diagram illustrating a structure of the scanning signal lines G, the data signal lines S, and the pixels electrodes of the display panel 2. (a) of each of FIGS. 16 to 19 illustrates polarities of voltages applied to pixel electrodes in a frame (the nth frame). (b) of each of FIGS. 16 to 19 illustrates polarities of voltages applied to pixel electrodes in a case where the frame inversion is carried out in a subsequent frame (the (n+1) frame). The polarities of the voltages applied to the pixel electrodes are indicated by +(plus) and −(minus) shown in each of FIGS. 16 to 19.

FIG. 16 illustrates an example of the source inversion. According to the source inversion, polarities of voltages to be applied are reversed for each of the data signal lines (source lines) S. This makes it possible to reverse the polarities of the voltages for every pixel electrodes arranged in the direction in which the scanning signal lines G extend (see FIG. 16).

FIG. 17 also illustrates the source inversion identical to that illustrated in FIG. 16. However, FIG. 17 is different from FIG. 16 in arrangement of the pixel electrodes. According to FIG. 16, pixel electrodes connected to each of the data signal lines S are provided on one side of the each of the data signal lines S (on the right side in the example illustrated in FIG. 16). In contrast, according to FIG. 17, the pixel electrodes connected to each of the data signal lines S are provided in a zigzag pattern with respect to the each of the data signal lines S. Therefore, the polarities of the voltages applied to pixel electrodes provided between adjacent ones of the data signal lines S are identical in the case of the arrangement illustrated in FIG. 16. However, the polarities of the voltages applied to the pixel electrodes provided between adjacent ones of the data signal lines S alternate in the case of the arrangement illustrated in FIG. 17.

FIG. 18 illustrates an example of the line inversion. According to the line inversion, polarities of voltages applied to the data signal lines S are reversed for each of the scanning signal lines G to be driven (for each of horizontal scanning periods). This makes it possible to reverse the polarities of the voltages for every pixel electrodes arranged in the direction in which the data signal lines S extend (see FIG. 18).

FIG. 19 illustrates an example of the dot inversion. The dot inversion can be carried out by combining the source inversion illustrated in FIG. 16 and the line inversion illustrated in FIG. 18. Specifically, when the first scanning signal line G1 is driven, a voltage applied to the first data signal line S is set to have a plus (+) polarity, and then polarities of voltages applied to the second and later data signal lines S are sequentially reversed. Next, when the second scanning signal line G2 is driven, a voltage applied to the first data signal line S is set to have a minus (−) polarity, and then polarities of voltages applied to the second and later data signal lines S are sequentially reversed. In a case where such a dot inversion is similarly repeated also when the third and later scanning signal lines G are driven, polarities of voltages applied to pixel electrodes adjacent to each other in the direction in which the scanning signal lines G extend and in the direction in which the data signal lines S extend can be different from each other (see FIG. 19).

As described above, the display device 1 which carries out the reverse polarity driving so as to prevent an image from sticking to the screen consumes more electric power due to the reverse polarity driving. For example, the display device 1 which carries out the dot inversion driving, in which a large amount of electric current is consumed during the scanning period, consumes more electric power. In view of this, in a case where the electronic apparatus including the display device 1 is configured such that the number of times of the detection by the detecting device 20 during the non-scanning period is controlled, as described above, in accordance with the state change detected by the state change detecting sections 31, 41, or 51, it is possible to improve detection accuracy of the detecting device while securing a remarkable effect of reducing electric power consumption.

Further, in a case where the display device 1 is an organic EL display device, the display device 1 consumes an extremely large amount of electric current during the scanning period. In view of this, in a case where the electronic apparatus including the display device is configured such that the number of times of the detection by the detecting device 20 during the non-scanning period is controlled, as described above, in accordance with the state change detected by the state change detecting sections 31, 41, or 51, it is possible to improve the detection accuracy of the detecting device while securing a remarkable effect of reducing electric power consumption.

(Another Configuration Example of Display Device)

FIG. 20 is an explanatory diagram illustrating another configuration example of the display device 1 illustrated in FIG. 1.

According to the display device 1 illustrated in FIG. 1, the timing control section 6 supplies, to the detecting section control section 22 of the detecting device 20, the TP detection control signal whose timing is identical to that of the pause drive control signal (see the arrow J in FIG. 1).

Note here that according to the display device 1 illustrated in FIG. 1, the timing control section 6 delays, by a few clocks to a few lines, supplying the sync control signal to the source driver after receiving the video signal (the clock signal, the sync signal, a video data signal). This is because a time is necessary for the timing control section 6 to, for example, generate a timing and process an image.

Alternatively, the display device 1 can be configured such that the scanning line drive circuit 3 includes gate driver sections 3a whose number is determined in accordance with the number of the scanning signal lines G (see FIG. 20). Note that FIG. 20 illustrates a case where the number of the gate driver sections 3a is two.

Further, the display device 1 can be configured such that the signal line drive circuit 4 includes source driver sections 4a whose number is determined in accordance with the number of the data signal lines S (see FIG. 20). Note that FIG. 20 illustrates a case where the number of the source driver sections 4a is three.

The source driver sections 4a recognize the scanning period (drive period) and the non-scanning period (pause period) more exactly than the timing control section 6 because such a delay as described above does not occur in the source driver sections 4a.

In view of this, one of the source driver sections 4a can be configured to supply the TP detection control via a connection terminal 71 to the detecting section control section 22 of the detecting device 20 (see FIG. 20). This makes it possible to more accurately control the detection by the detecting section 21 of the detecting device 20 (to more accurately transmit the pause period to the detecting device 20) by eliminating an influence of the delay occurring when the TP detection control signal is supplied from the timing control section 6 to the detecting section control section 22.

Note here that in each of the embodiments, a touch panel detection period (a period during which the detecting section 21 carries out the detection) does not need to correspond to a period during which the TP detection control signal is active. It is only necessary that the touch panel detection period be set within the period during which the TP detection control signal is active. Therefore, a start point in time and an end point in time of the touch panel detection period are set within the period during which the TP detection control signal is active.

As has been described, the electronic apparatus of the present invention includes a display device which repeats rewriting of image data while alternately repeating (i) a scanning period during which the image data is supplied to a plurality of pixels and (ii) a non-scanning period during which no image data is supplied to the plurality of pixels, the image data retained by the plurality of pixels; a detecting device which detects an input; a state change detecting section which detects a state change causing a change in detection accuracy which the detecting device is required to have so as to detect the input; and a control section which controls the detecting device, the detecting device detecting the input during the non-scanning period of the display device, and the control section controlling the detecting device so that the detecting device carries out the detection more times during the non-scanning period in a case where the state change detecting section detects the state change causing an improvement in detection accuracy which the detecting device is required to have so as to detect the input and so that the detecting device carries out the detection fewer times during the non-scanning period in a case where the state change detecting section detects the state change causing a deterioration in detection accuracy which the detecting device is required to have so as to detect the input.

Further, a method for controlling electronic apparatus of the present invention is a method for controlling electronic apparatus which includes: a display device which repeats rewriting of image data while alternately repeating (i) a scanning period during which the image data is supplied to a plurality of pixels and (ii) a non-scanning period during which no image data is supplied to the plurality of pixels, the image data retained by the plurality of pixels; and a detecting device which detects an input, the method including the steps of: (a) detecting a state change causing a change in detection accuracy which the detecting device is required to have so as to detect the input; and (b) controlling the detecting device, the detecting device detecting the input during the non-scanning period of the display device, and the step (b) being carried out so that the detecting device carries out the detection more times during the non-scanning period in a case where the state change causing an improvement in detection accuracy which the detecting device is required to have so as to detect the input is detected in the step (a) and so that the detecting device carries out the detection fewer times during the non-scanning period in a case where the state change causing a deterioration in detection accuracy which the detecting device is required to have so as to detect the input is detected in the step (a).

According to the above configuration, the state change detecting section detects the state change causing a change in detection accuracy which the detecting device is required to have so as to detect the input (in the step (a) of detecting the state change). The detecting device detects the input during the non-scanning period of the display device. The control section controls the detecting device so that the detecting device carries out the detection more times during the non-scanning period in the case where the state change detecting section detects the state change causing an improvement in detection accuracy which the detecting device is required to have so as to detect the input and so that the detecting device carries out the detection fewer times during the non-scanning period in the case where the state change detecting section detects the state change causing a deterioration in detection accuracy which the detecting device is required to have so as to detect the input (in the step (b) of controlling the detecting device).

Examples of the state change causing an improvement in detection accuracy which the detecting device is required to have so as to detect the input include: a change between (i) an input by use of means with which an input operation is easily detected and (ii) an input by use of means with which an input operation is not easily detected; activation and end of an operational mode (application) in which an input operation is carried out at a high speed; and a change in environment which change influences detection accuracy of the detecting device itself.

According to the electronic apparatus (the method for controlling the electronic apparatus), the detecting device carries out the detection more times during the non-scanning period, in the case where the state change causing an improvement in detection accuracy which the detecting device is required to have so as to detect the input (e.g., the state change which causes the detection accuracy of the detecting device to be relatively deteriorated) is detected. Therefore, even in a case where such a state change occurs in the electronic apparatus, it is possible to detect the input with respect to the detecting device with high accuracy.

Meanwhile, in the case where the state change causing a deterioration in detection accuracy which the detecting device is required to have so as to detect the input (e.g., the state change which causes the detection accuracy of the detecting device to be relatively improved) is detected, the detecting device carries out the detection fewer times during the non-scanning period. With this configuration, it is possible to prevent an increase in electric power consumption due to wasteful detection. Accordingly, it is possible to improve the detection accuracy of the detecting device while reducing electric power consumption.

The electronic apparatus can be arranged such that the control section includes: a first control section which outputs a detection number-of-times control signal that instructs the detecting device to carry out the detection more times in the case where the state change detecting section detects the state change causing an improvement in detection accuracy which the detecting device is required to have so as to detect the input and that instructs the detecting device to carry out the detection fewer times in the case where the state change detecting section detects the state change causing a deterioration in detection accuracy which the detecting device is required to have so as to detect the input; and a second control section which controls, in accordance with the detection number-of-times control signal, the detecting device so that the detecting device carries out the detection more or fewer times during the non-scanning period; and the display device includes the second control section.

According to the above configuration, the first control section outputs the detection number-of-times control signal that instructs the detecting device to carry out the detection more times in the case where the state change detecting section detects the state change causing an improvement in detection accuracy which the detecting device is required to have so as to detect the input and that instructs the detecting device to carry out the detection fewer times in the case where the state change detecting section detects the state change causing a deterioration in detection accuracy which the detecting device is required to have so as to detect the input. The second control section controls, in accordance with the detection number-of-times control signal, the detecting device so that the detecting device carries out the detection more or fewer times during the non-scanning period.

According to a configuration in which, among the first and second control sections, the display device includes at least the second control section, the second control section makes it possible to accurately control the number of times of the detection and a timing at which the detecting device carries out the detection during the non-scanning period of the display device, even in a case where (i) the first control section is provided, for example, outside the display device and (ii) the first control section fails to recognize the scanning period and the non-scanning period of the display device.

The electronic apparatus can be arranged such that: the detecting device detects an input operation carried out by a touch operation; the state change detecting section detects the state change causing a change in detection accuracy which the detecting device is required to have so as to detect the input operation; and the control section controls the detecting device so that the detecting device carries out the detection more times during the non-scanning period in a case where the state change detecting section detects the state change causing an improvement in detection accuracy which the detecting device is required to have so as to detect the input operation and so that the detecting device carries out the detection fewer times during the non-scanning period in a case where the state change detecting section detects the state change causing a deterioration in detection accuracy which the detecting device is required to have so as to detect the input operation.

According to the above configuration, the detecting device is, for example, a touch panel in which an input operation is carried out by a touch operation. The state change detecting section detects the state change causing a change in detection accuracy which the detecting device is required to have so as to detect the input operation. The control section controls the detecting device so that the detecting device carries out the detection more times during the non-scanning period, in the case where the state change detecting section detects the state change causing an improvement in detection accuracy which the detecting device is required to have so as to detect the input operation. Therefore, even in a case where such a state change occurs in the electronic apparatus, it is possible to detect the input operation with respect to the detecting device with high accuracy.

Meanwhile, the control section controls the detecting device so that the detecting device carries out the detection fewer times during the non-scanning period, in the case where the state change detecting section detects the state change causing a deterioration in detection accuracy which the detecting device is required to have so as to detect the input operation. With this configuration, it is possible to prevent an increase in electric power consumption due to wasteful detection. Accordingly, it is possible to improve the detection accuracy of the detecting device while reducing electric power consumption.

The electronic apparatus can be arranged such that the state change detecting section detects, as the state change, that a width of a contact with the detecting device of means for carrying out the input operation with respect to the detecting device has been changed between a broad width and a narrow width; and the control section controls the detecting device so that the detecting device carries out the detection more times during the non-scanning period in a case where the state change detecting section detects that the width of the contact has been changed from the broad width to the narrow width and so that the detecting device carries out the detection fewer times during the non-scanning period in a case where the state change detecting section detects that the width of the contact has been changed from the narrow width to the broad width.

According to the above configuration, the detecting device carries out the detection more times during the non-scanning period, in the case where the state change detecting section detects that the width of the contact has been changed from the broad width to the narrow width, that is, in a case where a state of the detecting device is changed from (i) a state in which the input operation is easily detected and the detection accuracy which the detecting device is required to have so as to detect the input operation is accordingly low to (ii) a state in which the input operation is not easily detected and the detection accuracy which the detecting device is required to have so as to detect the input operation is accordingly high. Therefore, even in a case where such a state change occurs in the electronic apparatus, it is possible to detect the input operation with respect to the detecting device with high accuracy.

Meanwhile, the detecting device carries out the detection fewer times during the non-scanning period, in the case where the state change detecting section detects that the width of the contact has been changed from the narrow width to the broad width, that is, in a case where a state of the detecting device is changed from (i) the state in which the input operation is not easily detected and the detection accuracy which the detecting device is required to have so as to detect the input operation is accordingly high to (ii) the state in which the input operation is easily detected and the detection accuracy which the detecting device is required to have so as to detect the input operation is accordingly low. With this configuration, it is possible to prevent an increase in electric power consumption due to wasteful detection. Accordingly, it is possible to improve the detection accuracy of the detecting device while reducing electric power consumption.

Note here that, between changes in contact width, there can be a given period during which nothing is detected.

The electronic apparatus can be arranged such that the state change detecting section detects, as the state change, that the input operation with respect to the detecting device has been changed from an input operation with a finger to an input operation with a pen; and the control section controls the detecting device so that the detecting device carries out the detection more times during the non-scanning period in a case where the state change detecting section detects that the input operation with respect to the detecting device has been changed from the input operation with the finger to the input operation with the pen.

According to the above configuration, in a case where the input operation with respect to the detecting device is changed from the input operation with the finger to the input operation with the pen, the state of the detecting device is changed from (i) the state in which the input operation is easily detected and the detection accuracy which the detecting device is required to have so as to detect the input operation is accordingly low to (ii) the state in which the input operation is not easily detected and the detection accuracy which the detecting device is required to have so as to detect the input operation is accordingly high. In this case, the detecting device carries out the detection more times during the non-scanning period. Therefore, even in a case where the input operation is carried out with the pen, it is possible to detect the input operation with respect to the detecting device with high accuracy.

The electronic apparatus can be arranged such that the state change detecting section detects, as the state change, that the input operation with respect to the detecting device has been changed from an input operation with a pen to an input operation with a finger; and the control section controls the detecting device so that the detecting device carries out the detection fewer times during the non-scanning period in a case where the state change detecting section detects that the input operation with respect to the detecting device has been changed from the input operation with the pen to the input operation with the finger.

According to the above configuration, in a case where the input operation with respect to the detecting device is changed from the input operation with the pen to the input operation with the finger, the state of the detecting device is changed from (i) the state in which the input operation is not easily detected and the detection accuracy which the detecting device is required to have so as to detect the input operation is accordingly high to (ii) the state in which the input operation is easily detected and the detection accuracy which the detecting device is required to have so as to detect the input operation is accordingly low. In this case, the detecting device carries out the detection fewer times during the non-scanning period. Therefore, it is possible to prevent an increase in electric power consumption due to wasteful detection.

Note here that, between changes in input operation from/to the input operation with the finger to/from the input operation with the pen, there can be a given period during which nothing is detected.

The electronic apparatus can be arranged such that the state change detecting section detects, as the state change, that an operational mode has been switched between a first operational mode in which the input operation is carried out with respect to the detecting device at a relatively low speed and a second operational mode in which the input operation is carried out with respect to the detecting device at a relatively high speed; and the control section controls the detecting device so that the detecting device carries out the detection more times during the non-scanning period in a case where the state change detecting section detects that the operational mode has been switched from the first operational mode to the second operational mode and so that the detecting device carries out the detection fewer times during the non-scanning period in a case where the state change detecting section detects that the operational mode has been switched from the second operational mode to the first operational mode.

According to the above configuration, in a case where the operational mode is switched from the first operational mode, in which the input operation is carried out with respect to the detecting device at a relatively low speed, to the second operational mode, in which the input operation is carried out with respect to the detecting device at a relatively high speed, the state of the detecting device is changed from (i) the state in which the input operation is easily detected and the detection accuracy which the detecting device is required to have so as to detect the input operation is accordingly low to (ii) the state in which the input operation is not easily detected and the detection accuracy which the detecting device is required to have so as to detect the input operation is accordingly high. In this case, the detecting device carries out the detection more times during the non-scanning period. Therefore, even in a case where the input operation is carried out at a relatively high speed, it is possible to detect the input operation with respect to the detecting device with high accuracy.

Meanwhile, in a case where the operational mode is switched from the second operational mode, in which the input operation is carried out with respect to the detecting device at a relatively high speed, to the first operational mode, in which the input operation is carried out with respect to the detecting device at a relatively low speed, the state of the detecting device is changed from (i) the state in which the input operation is not easily detected and the detection accuracy which the detecting device is required to have so as to detect the input operation is accordingly high to (ii) the state in which the input operation is easily detected and the detection accuracy which the detecting device is required to have so as to detect the input operation is accordingly low. In this case, the detecting device carries out the detection fewer times during the non-scanning period. Therefore, it is possible to prevent an increase in electric power consumption due to wasteful detection. Accordingly, it is possible to improve the detection accuracy of the detecting device while reducing the electric power consumption.

The electronic apparatus can be arranged such that the state change detecting section detects, as the state change, that an operational mode has been activated in which at least one handwriting input is carried out with respect to the detecting device; and the control section controls the detecting device so that the detecting device carries out the detection more times during the non-scanning period in a case where the state change detecting section detects that the operational mode has been activated in which the at least one handwriting input is carried out.

According to the above configuration, in a case where the operational mode is activated in which the at least one handwriting input is carried out at a high speed, the detection accuracy which the detecting device is required to have so as to carry out the detection is high. In this case, the detecting device carries out the detection more times during the non-scanning period. Therefore, even in a case where the input operation is carried out by a handwriting input at a high speed, it is possible to detect the input operation with respect to the detecting device with high accuracy.

The electronic apparatus can be arranged such that the control section controls the detecting device so that the detecting device carries out the detection fewer times during the non-scanning period in a case where the state change detecting section detects that the operational mode has been ended in which the handwriting input is carried out.

Further, the electronic apparatus can be arranged such that the control section controls the detecting device so that the detecting device carries the detection fewer times during the non-scanning period in a case where the state change detecting section detects that all operational modes have been ended in each of which an handwriting input is carried out.

According to the above configuration, in a case where the operational mode is ended in which the handwriting input is carried out at a high speed, the detection accuracy which the detecting device is required to have so as to carry out the detection is low. In this case, the detecting device carries out the detection fewer times during the non-scanning period. Therefore, it is possible to prevent an increase in electric power consumption due to wasteful detection.

The electronic apparatus can be arranged to further include a temperature sensor which detects an ambient temperature of the detecting device; the state change detecting section detecting, as the state change, that the ambient temperature detected by the temperature sensor which ambient temperature was within a given temperature range in which the detecting device can maintain given detection accuracy has exceeded the given temperature range; and the control section controlling the detecting device so that the detecting device carries out the detection more times during the non-scanning period in a case where the state change detecting section detects that the ambient temperature detected by the temperature sensor has exceeded the given temperature range.

According to the above configuration, in a case where the ambient temperature of the detecting device which ambient temperature was within the given temperature range in which the detecting device can maintain the given detection accuracy exceeds the given temperature range, the detecting device carries out the detection more times during the non-scanning period. Therefore, even in a case where the ambient temperature of the detecting device exceeds the given temperature range in which the detecting device can maintain the given detection accuracy, it is possible to detect the input operation with respect to the detecting device with high accuracy.

The electronic apparatus can be arranged to further include a temperature sensor which detects an ambient temperature of the detecting device; the state change detecting section detecting, as the state change, that the ambient temperature detected by the temperature sensor which ambient temperature was beyond a given temperature range in which the detecting device can maintain given detection accuracy has fallen within the given temperature range; and the control section controlling the detecting device so that the detecting device carries out the detection fewer times during the non-scanning period in a case where the state change detecting section detects that the ambient temperature detected by the temperature sensor has fallen within the given temperature range.

According to the above configuration, in a case where the ambient temperature of the detecting device which ambient temperature was beyond the given temperature range in which the detecting device can maintain the given detection accuracy falls within the given temperature range, the detecting device carries out the detection fewer times during the non-scanning period. Therefore, it is possible to prevent an increase in electric power consumption due to wasteful detection.

The electronic apparatus can be arranged such that the display device is a liquid crystal display device.

According to the above configuration, it is possible to improve the detection accuracy of the detecting device of the electronic apparatus including the liquid crystal display device which serves as a display device, while reducing the electric power consumption.

The electronic apparatus can be arranged such that the display device reverses, in a predetermined cycle in one frame, a polarity of a voltage applied to a display element According to the above configuration, the display device which carries out the reverse polarity driving so as to prevent an image from sticking to a screen consumes more electric power due to the reverse polarity driving. For example, the display device which carries out dot inversion driving, in which a large amount of electric current is consumed during the scanning period, consumes more electric power. In view of this, in a case where the electronic apparatus including the display device is configured such that the number of times of the detection by the detecting device during the non-scanning period is controlled, as described above, in accordance with the state change detected by the state change detecting section, it is possible to improve the detection accuracy of the detecting device while securing a remarkable effect of reducing electric power consumption.

The electronic apparatus can be arranged such that the display device is an organic EL display device.

According to the above configuration, the organic EL display device consumes an extremely large amount of electric current during the scanning period. In view of this, in a case where the electronic apparatus including the display device is configured such that the number of times of the detection by the detecting device during the non-scanning period is controlled, as described above, in accordance with the state change detected by the state change detecting section, it is possible to improve the detection accuracy of the detecting device while securing a remarkable effect of reducing electric power consumption.

The electronic apparatus can be arranged such that the display device includes a signal line drive circuit which outputs display image data; and the signal line drive circuit outputs a detection control signal which instructs the detecting device on a timing at which the detecting device carries out the detection.

According to the above configuration, the signal line drive circuit, which best recognizes the scanning period (drive period) and the non-scanning period (pause period) of the display device, supplies the detection control signal to the detecting device. This makes it possible to more accurately control the detection by the detecting device during the non-scanning period.

The electronic apparatus can be arranged such that the detecting device is a matrix capacitance touch panel.

According to the above configuration, the matrix capacitance touch panel is widely used as the detecting device of the electronic apparatus. Meanwhile, the matrix capacitive touch panel easily suffers a deterioration in detection accuracy because S/N decreases due to noise produced from the display device. In view of this, in a case where the electronic apparatus including the detecting device thus configured is configured such that the number of times of the detection by the detecting device during the non-scanning period is controlled, as described above, in accordance with the state change detected by the state change detecting section, it is possible to suitably improve detection accuracy of the detecting device while reducing electric power consumption.

The electronic apparatus can be arranged such that the detecting device includes a high-frequency circuit.

The above configuration enables the detecting device including the high-frequency circuit to receive an input signal which is a high frequency signal as an input signal for the detecting device. Meanwhile, the detecting device easily suffers a deterioration in detection accuracy because S/N decreases due to noise produced from the display device. In view of this, in a case where the electronic apparatus including the detecting device thus configured is configured such that the number of times of the detection by the detecting device during the non-scanning period is controlled, as described above, in accordance with the state change detected by the state change detecting section, it is possible to suitably improve detection accuracy of the detecting device while reducing electric power consumption.

The present invention is not limited to the descriptions of the embodiments above, but may be altered by a skilled person within the scope of the claims. An embodiment derived from a proper combination of technical means disclosed in different embodiments is also encompassed in the technical scope of the present invention.

INDUSTRIAL APPLICABILITY

The present invention is widely applicable to an electronic apparatus including (i) a display device such as a liquid crystal display device, an organic EL display device, or electronic paper and (ii) a detecting device such as a touch panel.

REFERENCE SIGNS LIST

1 Display device
2 Display panel
3 Scanning line drive circuit
3a Gate driver section
4a Source driver section
4 Signal line drive circuit
6 Timing control section (control section, second control section)
20 Detecting device
21 Detecting section
22 Detecting section control section
30 System side control section (control section, first control section)
31 State change detecting section
32 TP detection control section (control section, first control section)
41 State change detecting section
51 State change detecting section
71 Connection terminal
100 Electronic apparatus
101 Electronic apparatus
102 Electronic apparatus
103 Electronic apparatus

The invention claimed is:

1. An electronic apparatus comprising:
a display device which repeats rewriting of image data while alternately repeating (i) a scanning period during which the image data is supplied to a plurality of pixels and (ii) a non-scanning period during which no image data is supplied to the plurality of pixels, the image data retained by the plurality of pixels;
a detecting device which detects an input;
a state change detecting section which detects a state change causing a change in detection accuracy which the detecting device is required to have so as to detect the input; and
a control section which controls the detecting device,
the detecting device detecting the input during the non-scanning period of the display device, and
the control section controlling the detecting device so that the detecting device carries out the detection more times during the non-scanning period in a case where the state change detecting section detects the state change causing an improvement in detection accuracy which the detecting device is required to have so as to detect the input and so that the detecting device carries out the detection fewer times during the non-scanning period in a case where the state change detecting section detects the state change causing a deterioration in detection accuracy which the detecting device is required to have so as to detect the input.

2. The electronic apparatus as set forth in claim 1, wherein:
the control section includes:
a first control section which outputs a detection number-of-times control signal that instructs the detecting device to carry out the detection more times in the case where the state change detecting section detects the state change causing an improvement in detection accuracy which the detecting device is required to have so as to detect the input and that instructs the detecting device to carry out the detection fewer times in the case where the state change detecting section detects the state change causing a deterioration in detection accuracy which the detecting device is required to have so as to detect the input; and a second control section which controls, in accordance with the detection number-of-times control signal, the detecting device so that the detecting device carries out the detection more or fewer times during the non-scanning period; and the display device includes the second control section.

3. The electronic apparatus as set forth in claims 1, wherein:

the detecting device detects an input operation carried out by a touch operation;

the state change detecting section detects the state change causing a change in detection accuracy which the detecting device is required to have so as to detect the input operation; and the control section controls the detecting device so that the detecting device carries out the detection more times during the non-scanning period in a case where the state change detecting section detects the state change causing an improvement in detection accuracy which the detecting device is required to have so as to detect the input operation and so that the detecting device carries out the detection fewer times during the non-scanning period in a case where the state change detecting section detects the state change causing a deterioration in detection accuracy which the detecting device is required to have so as to detect the input operation.

4. The electronic apparatus as set forth in claim 3, wherein:

the state change detecting section detects, as the state change, that a width of a contact with the detecting device of means for carrying out the input operation with respect to the detecting device has been changed between a broad width and a narrow width; and the control section controls the detecting device so that the detecting device carries out the detection more times during the non-scanning period in a case where the state change detecting section detects that the width of the contact has been changed from the broad width to the narrow width and so that the detecting device carries out the detection fewer times during the non-scanning period in a case where the state change detecting section detects that the width of the contact has been changed from the narrow width to the broad width.

5. The electronic apparatus as set forth in claim 3, wherein:

the state change detecting section detects, as the state change, that the input operation with respect to the detecting device has been changed from an input operation with a finger to an input operation with a pen; and the control section controls the detecting device so that the detecting device carries out the detection more times during the non-scanning period in a case where the state change detecting section detects that the input operation with respect to the detecting device has been changed from the input operation with the finger to the input operation with the pen.

6. The electronic apparatus as set forth in claim 3, wherein:

the state change detecting section detects, as the state change, that the input operation with respect to the detecting device has been changed from an input operation with a pen to an input operation with a finger; and the control section controls the detecting device so that the detecting device carries out the detection fewer times during the non-scanning period in a case where the state change detecting section detects that the input operation with respect to the detecting device has been changed from the input operation with the pen to the input operation with the finger.

7. The electronic apparatus as set forth in claim 3, wherein:

the state change detecting section detects, as the state change, that an operational mode has been switched between a first operational mode in which the input operation is carried out with respect to the detecting device at a relatively low speed and a second operational mode in which the input operation is carried out with respect to the detecting device at a relatively high speed; and the control section controls the detecting device so that the detecting device carries out the detection more times during the non-scanning period in a case where the state change detecting section detects that the operational mode has been switched from the first operational mode to the second operational mode and so that the detecting device carries out the detection fewer times during the non-scanning period in a case where the state change detecting section detects that the operational mode has been switched from the second operational mode to the first operational mode.

8. The electronic apparatus as set forth in claim 3, wherein:

the state change detecting section detects, as the state change, that an operational mode has been activated in which at least one handwriting input is carried out with respect to the detecting device; and the control section controls the detecting device so that the detecting device carries out the detection more times during the non-scanning period in a case where the state change detecting section detects that the operational mode has been activated in which the at least one handwriting input is carried out.

9. The electronic apparatus as set forth in claim 3, wherein:

the state change detecting section detects, as the state change, that an operational mode has been ended in which a handwriting input is carried out with respect to the detecting device; and the control section controls the detecting device so that the detecting device carries out the detection fewer times during the non-scanning period in a case where the state change detecting section detects that the operational mode has been ended in which the handwriting input is carried out.

10. An electronic apparatus as set forth in claim 3, further comprising:

a temperature sensor which detects an ambient temperature of the detecting device;

the state change detecting section detecting, as the state change, that the ambient temperature detected by the temperature sensor which ambient temperature was within a given temperature range in which the detecting device can maintain given detection accuracy has exceeded the given temperature range; and the control section controlling the detecting device so that the detecting device carries out the detection more times during the non-scanning period in a case where the state change detecting section detects that the ambient temperature detected by the temperature sensor has exceeded the given temperature range.

11. An electronic apparatus as set forth in claim 3, further comprising:

a temperature sensor which detects an ambient temperature of the detecting device;

the state change detecting section detecting, as the state change, that the ambient temperature detected by the temperature sensor which ambient temperature was beyond a given temperature range in which the detecting device can maintain given detection accuracy has fallen within the given temperature range; and the control section controlling the detecting device so that the detecting device carries out the detection fewer times during the non-scanning period in a case where the state change detecting section detects that the ambient temperature detected by the temperature sensor has fallen within the given temperature range.

12. The electronic apparatus as set forth in claim 1, wherein the display device is a liquid crystal display device.

13. The electronic apparatus as set forth in claim 1, wherein the display device reverses, in a predetermined cycle in one frame, a polarity of a voltage applied to a display element.

14. The electronic apparatus as set forth in claim 1, wherein the display device is an organic EL display device.

15. The electronic apparatus as set forth in claim 1, wherein:

the display device includes a signal line drive circuit which outputs display image data; and the signal line drive circuit outputs a detection control signal which instructs the detecting device on a timing at which the detecting device carries out the detection.

16. The electronic apparatus as set forth in claim 3, wherein the detecting device is a capacitance touch panel.

17. The electronic apparatus as set forth in claim 1, wherein the detecting device includes a high-frequency circuit.

18. A method for controlling an electronic apparatus including: a display device which repeats rewriting of image data while alternately repeating (i) a scanning period during which the image data is supplied to a plurality of pixels and (ii) a non-scanning period during which no image data is supplied to the plurality of pixels, the image data retained by the plurality of pixels; and a detecting device which detects an input, said method comprising the steps of:

(a) detecting a state change causing a change in detection accuracy which the detecting device is required to have so as to detect the input; and (b) controlling the detecting device, the detecting device detecting the input during the non-scanning period of the display device, and the step (b) being carried out so that the detecting device carries out the detection more times during the non-scanning period in a case where the state change causing an improvement in detection accuracy which the detecting device is required to have so as to detect the input is detected in the step (a) and so that the detecting device carries out the detection fewer times during the non-scanning period in a case where the state change causing a deterioration in detection accuracy which the detecting device is required to have so as to detect the input is detected in the step (a).

* * * * *